US006832364B2

(12) United States Patent  
Heng et al.

(10) Patent No.: US 6,832,364 B2
(45) Date of Patent: Dec. 14, 2004

(54) INTEGRATED LITHOGRAPHIC LAYOUT OPTIMIZATION

(75) Inventors: Fook-Luen Heng, Yorktown Heights, NY (US); Lars W. Liebmann, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 183 days.

(21) Appl. No.: 10/264,142

(22) Filed: Oct. 3, 2002

(65) Prior Publication Data

US 2004/0068712 A1 Apr. 8, 2004

(51) Int. Cl.[7] .............................................. G06F 17/50
(52) U.S. Cl. ......................................... 716/21; 716/19
(58) Field of Search ............................ 716/19–21, 1–8, 716/10; 430/311, 4–6, 28–30

(56) References Cited

U.S. PATENT DOCUMENTS

| | | | |
|---|---|---|---|
| 5,528,508 A | 6/1996 | Russell et al. | |
| 5,537,648 A | 7/1996 | Liebmann et al. | |
| 5,636,131 A | 6/1997 | Liebmann et al. | |
| 5,883,813 A | 3/1999 | Kim et al. | |
| 6,057,063 A | 5/2000 | Liebmann et al. | |
| 6,083,275 A | 7/2000 | Heng et al. | |
| 6,187,480 B1 * | 2/2001 | Huang | 430/5 |
| 6,523,165 B2 * | 2/2003 | Liu et al. | 716/21 |
| 6,566,023 B2 * | 5/2003 | Wang et al. | 430/5 |
| 6,584,610 B1 * | 6/2003 | Wu et al. | 716/19 |
| 6,609,245 B2 * | 8/2003 | Liebmann et al. | 716/21 |
| 6,704,921 B2 * | 3/2004 | Liu | 716/19 |
| 2002/0028392 A1 * | 3/2002 | Jin et al. | 430/5 |

FOREIGN PATENT DOCUMENTS

WO     WO 01/20502 A1     3/2001

OTHER PUBLICATIONS

Liebmann et al., "Enabling Alternating Phase Shifted Mask Designs for a Full Logic Gate Level: Design Rules and Design Rule Checking," in Design Automation Confrence 2001 (Jun. 18–22, 2001), pp. 79–84.

Heng et al., "Application of Automated Design Migration to Alternating Phase Shift Mask Design," Proceedings, 2001 International Symposium on Physical Design, (Apr. 1–4, 2001), pp. 38–43.

Wong et al., "Alternating Phase–Shifting Mask with Reduced Aberration Sensitivity: Lithography Considerations," in Optical Microlithography XIV (C. Progler, ed.), Proceedings of SPIE, vol. 4346 (2001), pp. 420–428.

(List continued on next page.)

Primary Examiner—Matthew Smith
Assistant Examiner—Binh Tat
(74) Attorney, Agent, or Firm—Todd M. C. Li

(57) ABSTRACT

A method and computer system is described for designing a conflict-free altPSM layout by first constructing a planar interlock graph without predefining phase shift shapes. Feature nodes of the graph represent critical elements, while connection nodes of the graph represent phase shape interactions. A pattern analysis of the interlock graph is performed to identify layout violations. Solutions for resolving layout conflicts are applied to the layout resulting in at least one conflict-free altPSM layout. Phase shapes are then applied to the conflict-free altPSM layout. Selection of an optimal solution can be made based on cost analysis.

18 Claims, 20 Drawing Sheets

OTHER PUBLICATIONS

Kahng et al., "New Graph Bipartizations for Double–Exposure, Bright Field Alternating Phase–Shift Mask Layout," Design Automation Conference, Asia and South Pacific, Proceedings of ASP–DAC 2001 (Jan. 2001), pp. 133–138.

Lee, D. T., "Medial Axis Transformation of a Planar Shape," IEEE Transactions on Pattern Analysis and Machine Intelligence, vol. PAMI–4, No. 4 (Jul. 1982), pp. 363–369.

Papadopoulou, E., "L Voronoi Diagrams and Applications to VLSI Layout and Manufacturing," in Proceedings, Ninth International Symposium on Algorithms and Computation (Dec. 14–16, 1998), pp. 9–18.

Heng et al., "A VLSI Artwork Legalization Technique Based on a New Criterion of Minimum Layout Perturbation," in Proceedings, 1997 International Symposium on Physical Design (Apr. 14–16, 1997), pp. 116–121.

U.S. patent application Ser. No. 10/014,707, Filed Nov. 13, 2001, pending, entitled "Alternating phase shift mask design with optimized phase shapes".

Liao, Y.S. et al., "An algorithm to compact a VLSI symbolic layout with mixed constraints" Proceedings, 20th Design Automation Conference (Jun. 27–29, 1983), pp. 107–112.

Liebmann et al., "TCAD Development for Lithography Resolution Enhancement," IBM J. Res. & Dev., vol. 45, No. 5 (Sep. 2001), pp. 651–665.

Liebmann et al., "Optimizing Style Options for Sub–Resolution Assist Features," in Optical Microlithography XIV (C. Progler, ed.), Proceedings of SPIE, vol. 4346 (2001), pp. 141–152.

* cited by examiner

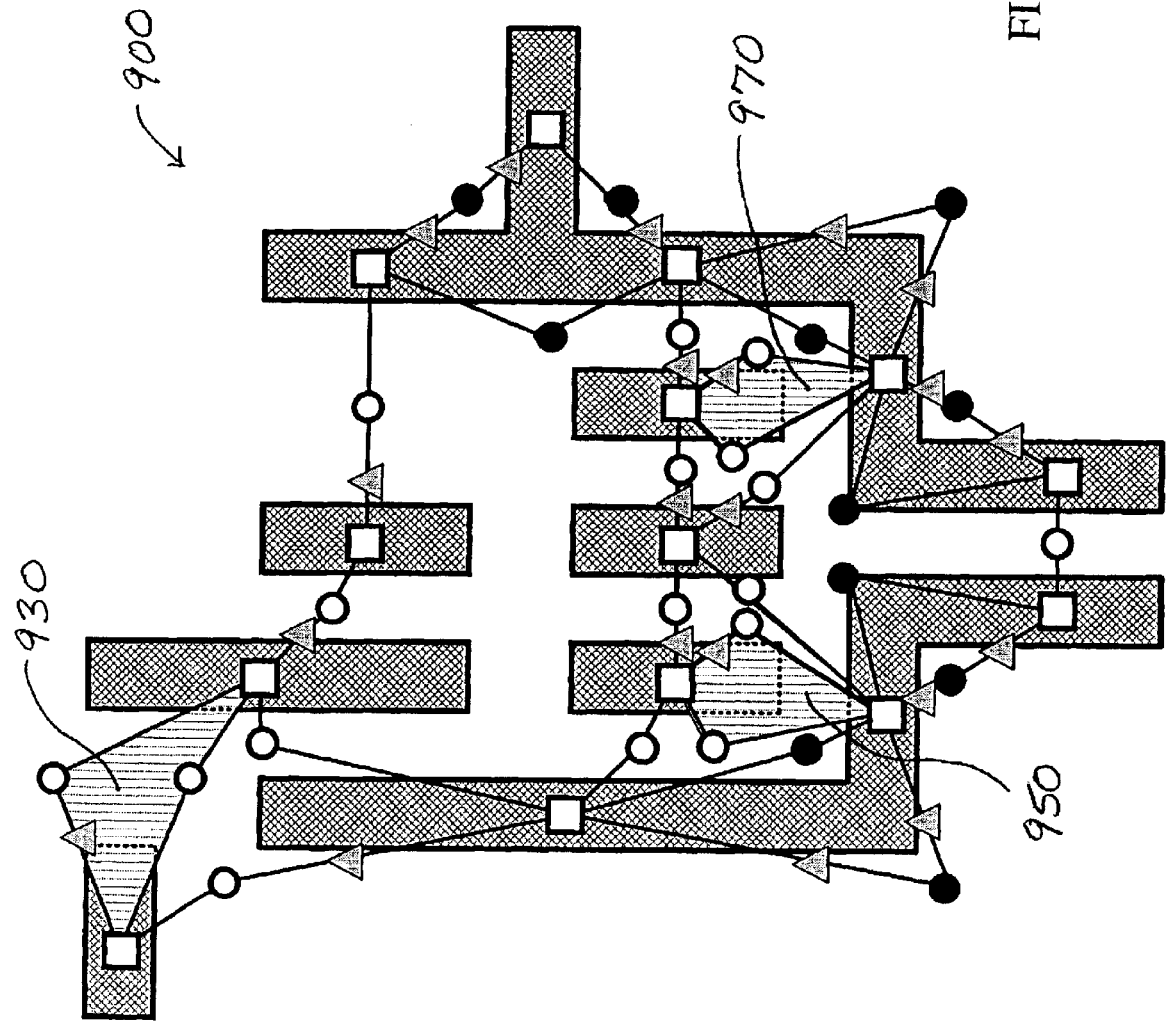

INTEGRATED LITHOGRAPHIC LAYOUT OPTIMIZATION

The present invention relates to the manufacture of very large scale integrated (VLSI) circuits and, more particularly, to the enhancement of photolithographic images through the use of phase shifted masks.

BACKGROUND OF THE INVENTION

A very large scale integrated (VLSI) complementary metal oxide semiconductor (CMOS) chip is manufactured on a silicon wafer by a sequence of material additions (i.e., low pressure chemical vapor depositions, sputtering operations, etc.), material removals (i.e., wet etches, reactive ion etches, etc.), and material modifications (i.e., oxidations, ion implants, etc.). These physical and chemical operations interact with the entire wafer. For example, if a wafer is placed into an acid bath, the entire surface of the wafer will be etched away. In order to build very small electrically active devices on the wafer, the impact of these operations has to be confined to small, well defined regions.

Lithography in the context of VLSI manufacturing of CMOS devices is the process of patterning openings in photosensitive polymers (sometimes referred to as photoresists or resists) which define small areas in which the silicon base material is modified y a specific operation in a sequence of processing steps. The manufacturing of CMOS chips involves the repeated patterning of photoresist, followed by an etch, implant, deposition, or other operation, and ending with the removal of the expended photoresist to make way for the new resist to be applied for another iteration of this process sequence.

The basic lithography system consists of a light source, a stencil or photo mask containing the pattern to be transferred to the wafer, a collection of lenses, and a means for aligning existing patterns on the wafer with patterns on the mask. The aligning may take place in an aligning step or steps and may be carried out with an aligning apparatus. Since a wafer containing from 50 to 100 chips is patterned in steps of 1 to 4 chips at a time, these lithography tools are commonly referred to as steppers. The resolution, R, of an optical projection system such as a lithography stepper is limited by parameters described in Raleigh's equation:

$$R = k \, \lambda/NA,$$

where $\lambda$ represents the wavelength of the light source used in the projection system and NA represents the numerical aperture of the projection optics used. "k" represents a factor describing how well a combined lithography system can utilize the theoretical resolution limit in practice and can range from about 0.8 down to about 0.5 for standard exposure systems. The highest resolution in optical lithography is currently achieved with deep ultra violet (DUV) steppers operating at 248 nm wavelengths of 356 nm are also in widespread use and 193 nm wavelength lithography is becoming commonplace.

Conventional photo masks consist of chromium patterns on a quartz plate, allowing light to pass wherever the chromium has been removed from the mask. Light of a specific wavelength is projected through the mask onto the photoresist coated wafer, exposing the resist wherever hole patterns are placed on the mask. Exposing the resist to light of the appropriate wavelength causes modifications in the molecular structure of the resist polymers which, in common applications, allow a developer to dissolve and remove the resist in the exposed areas. Such resist materials are known as positive resists. (Negative resist systems allow only unexposed resist to be developed away.) The photo masks, when illuminated, can be pictured as an array of individual, infinitely small light sources which can be either turned on (points in clear areas) or turned off (points covered by chrome). If the amplitude of the electric field vector which describes the light radiated by these individual light sources is mapped across a cross section of the mask, a step function will be plotted reflecting the two possible states that each point on the mask can be found (light on, light off).

These conventional photo masks are commonly referred to as chrome on glass (COG) binary masks, due to the binary nature of the image amplitude. The perfectly square step function of the light amplitude exists only in the theoretical limit of the exact mask plane. At any given distance away from the mask, such as in the wafer plane, diffraction effects will cause images to exhibit a finite image slope. At small dimensions, that is, when the size and spacing of the images to be printed are small relative to the $\lambda/NA$, electric field vectors of adjacent images will interact and add constructively. The resulting light intensity curve between the image features is not completely dark, but exhibits significant amounts of light intensity created by the interaction of adjacent features. The resolution of an exposure system is limited by the contrast of the projected image, that is, the intensity difference between adjacent light and dark image features. An increase in the light intensity in nominally dark regions will eventually cause adjacent features to print as one combined structure rather than discrete images.

As VLSI lithography is being challenged to deliver manufacturable patterning solutions at unprecedented resolution levels, strong resolution enhancement techniques (RET) are becoming increasingly popular. Techniques such as sub-resolution-assist-features (SRAF) combined with off-axis-illumination (OAI) and attenuated phase shifted mask (PSM), alternating phase shifted mask (altPSM), or dipole feature decomposition offer the possibility of doubling the resolution of conventional lithography (see Liebmann et al., "TCAD Development for Lithography Resolution Enhancement," IBM J. Res. & Dev., Vol. 45, no. 5 (September 2001), pp. 651–665). This increased resolution is bought at the cost of complex layout manipulations (for example, see Liebmann et al., "Optimizing Style Options for Sub-Resolution Assist Features," in Optical Microlithography XIV (C. Progler, ed.), Proceedings of SPIE, Vol. 4346 (2001), pp. 141–152). Post tape-out or post-layout implementation of strong RET (i.e., implementation of RET after physical design and verification), is limited in scope and effectiveness. To realize the full potential of strong RET, layout optimization has to occur at the physical design level. AltPSM was the first RET to clearly demonstrate the need for deep integration into the design flow (see Liebmann et al., "Enabling Alternating Phase Shifted Mask Designs for a Full Logic Gate Level: Design Rules and Design Rule Checking," in Design Automation Conference 2001 (Jun. 18–22, 2001), pp.79–84) and will be used here to exemplify the concept of integrated RET layout optimization.

The quality with which small images can be replicated in lithography depends largely on the available process window; that is, that amount of allowable dose and focus variation that still results in correct image size. Phase shifted mask (PSM) lithography improves the lithographic process window or allows operation at a lower k value by introducing a third parameter on the mask. The electric field vector, like any vector quantity, has a magnitude and direction, so, in addition to turning the electric field amplitude on and off, it can be turned on with a phase of about 0° or turned on with a phase of about 180°. This phase variation is achieved in PSMs by modifying the length that a light beam travels through the mask material. By recessing the mask to an appropriate depth, light traversing the thinner portion of the mask and light traversing the thicker portion of the masks will be 180° out of phase, that is, their electric field vector will be of equal magnitude but point in exactly the opposite direction so that any interaction between these light beams result in perfect cancellation. However, because the 180° phase transition forces a minimum in the image intensity, narrow dark lines will be printed. These unwanted residual phase images are erased using a trim mask, which is a second mask that transmits light only in regions left unexposed by the residual phase edge.

Alternating Phase Shifted Mask (altPSM) lithography is a resolution enhancement technique (RET) that is rapidly gaining acceptance as a viable solution to meet aggressive integrated circuit (IC) technology scaling time-lines. Delays in next generation optical and non-optical lithography tooling add vital importance to successful implementation of altPSM. AltPSM takes advantage of destructive interference of light to double the achievable resolution of an optical lithography system. Stated another way, this resolution enhancement technique results in a k-factor that has a theoretical limit of 0.25, rather than 0.5 as in conventional lithographic techniques. The light interference is created by selectively manipulating the topography of the photomask to introduce an appropriate path-length difference in the imaging light. The design of the altPSM involves disposing phase shifting shapes on opposing sides of the sub-cutoff dimension, where one phase shape is assigned a phase shift that is 180° out of phase from that of the opposing phase shape.

In addition to being assigned opposite phases, these phase shapes or regions need to obey a variety of lithographic, mask manufacturability, and design rules governing their size and spacings. Thus, layout decisions must be made regarding the size, spacing, and phase assignment of these phase shapes relative to the layout of circuit elements. Some rules are mutually opposing and require careful optimization. This manipulation of the mask topography requires phase information to be added to the circuit layout in the computer-aided design (CAD) system (see, for example, Russell et al., "System and Method for Verifying a Hierarchical Circuit Desing," U.S. Pat. No. 5,528,508). Key to the successful implementation of altPSM is an efficient electronic design automation (EDA) tool that can convert circuit designs to altPSM layouts with minimal impact to layout design density or design complexity. A phase shifting program creates phase shapes of appropriate width, spacing, and color (i.e. phase assignment) for an altPSM compliant layout and reports conflicts for a non-compliant layout (see, for example, Liebmann et al., "Phase Shifted Mask Design System, Phase Shifted Mask and VLSI Circuit Devices Manufactured Therewith," U.S. Pat. No. 6,057,063, hereinafter referred to as Liebmann et al. '063). The conflicts reported only describe regions where the phase assignment fails. It is not trivial to provide useful insight on how and where to resolve the conflicts, due to the complex topological interlock of phase shapes.

Methods to assign and optimize phases in an altPSM design are known in the art, for example, as described in U.S. Pat. Nos. 5,537,648 and 5,636,131 (hereinafter, Liebmann et al. '648) and Liebmann et al. '063. FIG. 1 illustrates a flow chart typical of such methods. After creating an initial circuit layout (Block 401), the design of the altPSM (Block 400) is performed. Critical circuit elements having critical dimension CD are identified, as indicated in Block 410 of FIG. 1. Phase shapes are defined in association with each critical element (Block 420). Then the phase shapes are legalized according to the various rules as discussed below (Block 430). Next, the appropriate phases are assigned to each phase shape (Block 440), ensuring binary coloring across the entire mask layout. A method for performing binary coloring is described, for example, in Kim et al., "Automatic Generation of Phase Shift Masks Using Net Coloring," U.S. Pat. No. 5,883,813 (hereinafter referred to as Kim et al. '813). The phase coloring method of Kim et al. '813 involves the formation of nets of phase shapes by creating a "connected" function that links or couples phase shapes across critical elements as intrusion pairs, meaning that the phase of one shape determines the phase of the other shape in the intrusion pair. The "connected" function also includes shapes that are close enough the be phase coupled. "Close enough" could mean that there must be a minimum phase-to-phase spacing, which will be discussed further below. After the phase have been assigned in conformance with the various rules, the layout is checked for any inconsistencies or errors (Block 450). If layout conforms with all rules, then the altPSM design is accepted and the associated trim mask is then designed (Block 409). Since it may not be possible to correct all such errors, it may be necessary to accept a loss in process window, or re-design the circuit layout (Block 460).

An altPSM legalization program (e.g. Block 430) attempts to make a VLSI layout altPSM compliant so that phase shapes can be created successfully. There are two basic approaches.

In the first approach, design rules between design shapes are derived from the constraints among phase shapes and constraints between phase shapes and design shapes. It then turns to a traditional design rule correction approach to legalize the layout based on the derived rules (see, for example, Heng et al., "Application of Automated Design Migration to Alternating Phase Shift Mask Design," Proceedings, 2001 International Symposium on Physical Design, (Apr. 1–4, 2001), pp. 38–43). This approach has worked well in practice but has two significant limitations:

1. Some complex topological configurations that cause phase shift non-compliance over long distances and involving many individual phase transitions, commonly referred to as odd-even runs, cannot be captured and enforced by local, shapes-centric design rules. An odd-even run is illustrated in FIG. 2 showing vertically oriented critical design elements 710, 711, 712, 713, 714, 715 and 716. Phase shift shapes 120, 130, 140, 150, 160, 170 and 180 are disposed on opposing sides of each of the design elements, but the requirement of 180° phase shift on opposing sides of each critical element cannot be achieved for this layout configuration.

2. As resolution limits continue to tighten lithography process windows, it is becoming increasingly necessary to locally optimize phase shift design parameters. That is, where in the past, phase width was a constant for a given technology generation, now phase width depends on local layout details (see, for example, commonly assigned co-pending application Ser. No. 10/014,707). Enhanced altPSM (see, for example, Wong et al., "Alternating Phase-Shifting Mask with Reduced Aberration Sensitivity: Lithography Considerations," in Optical Microlithography XIV (C. Progler, ed.), Proceedings of SPIE, Vol 4346 (2001), pp. 420–428), improves aberration insensitivity by adding secondary phase regions to more isolated phase edges. Overall, this added complexity in the phase parameters makes it so difficult as to be virtually impossible or impractical to convert phase design parameters to layout design rules.

In the second approach, a graph theoretical technique (see Kahng et al., "New Graph Bipartizations for Double-Exposure, Bright Field Alternating Phase-Shift Mask Layout," Design Automation Conference, Asia and South Pacific, Proceedings of ASP-DAC 2001 (January, 2001), pp.133–138; and Kahng et al. "Optimal Phase Conflict Removal for Layout of Alternating Phase-Shifting Masks," PCT Application, WO 01/20502, 22 March 2001) is used to describe the topological conflict between phase shapes of rectangular design shapes. However, the graph theoretical method of Kahng et al. has two major drawbacks:

1. The conflict graph is constructed based on predefined rectangular phase shapes and identifies phase conflicts based on overlapping of these predefined rectangular phase shapes.
2. It provides for conflict resolution by only two types of layout modifications, namely, increasing the spacing between two critical features or by increasing the width of a critical feature.

Thus, the method of Kahng et al. does not model the legality of phase shapes explicitly, and will not allow conflict resolution by changing or merging phase shapes, or other solutions such as modifying both phase shapes and critical features. The graph theoretical analysis of Kahng et al. fails to provide a solution for T-junctions.

In view of the foregoing discussion, there is a need to provide for a method for optimizing an altPSM design layout that flexibly integrates rules and constraints for both critical design features and phase shift features, and allows conflict resolution of complex layout configurations, as well as optimization of phase shapes.

SUMMARY OF THE INVENTION

In accordance with the present invention, an integrated approach is described for producing a conflict-free, resolution-enhanced alternating phase shift layout by combining RET layout manipulation with a layout legalization process.

The RET layout manipulation process of the present invention includes creation of a phase interlock graph that is created to capture the topological interaction (i.e., phase interlock) between phase shapes, without pre-determining the size and shape of phase shifting shapes. The phase interlock graph of the present invention does not pre-determine the merging or splitting of interacting phase shapes based on their existing proximity, but instead represents potential interaction or interlocking between phase shapes and lets, the conflict analysis process determine whether interacting phase shapes should be merged or should be split.

In accordance with the present invention, the phase interlock graph is constructed from nodes identifying design elements and their topological relationship without predetermining the shapes and dimensions of those design elements. Nodes representing critical design segments (i.e., those design elements having critical dimensions to be printed) may be identified by using an interior Voronoi diagram, also known as medial axis (see Lee, D. T., "Medial Axis Transformation of a Planar Shape," IEEE Transactions on Pattern Analysis and Machine Intelligence, Vol. PAMI-4, no. 4 (July 1982), pp. 363–369) of a general polygon. Nodes that represent the interactions between phase shapes may be determined by bisectors between phase shape representors which act as placeholders for phase shapes in the altPSM design. One method for determining the bisector between phase shape representors is to construct an exterior Voronoi diagram that is exterior to the polygons that form the critical design elements of the initial layout (see Papadopoulou, E., "$L_{oo}$ Voronoi Diagrams and Applications to VLSI Layout and Manufacturing," in Proceedings, Ninth International Symposium on Algorithms and Computation (Dec. 14–16, 1998), pp. 9–18). If two edges of two phase shapes share a common Voronoi bisector, they have the potential to interfere with each other. A built-in or pre-determined distance may be used to prune unnecessary interaction, so that, for example, phase shapes that are too far will not interact. The phase interlock graph captures the interaction between interfering phase shapes, the planarity of the voronoi diagram guarantees the planarity of the phase interlock graph.

Since the phase interlock graph is a planar graph by construction, the planarity property of the interlock graph is used to analyze the nature of the phase conflict violations. This topological pattern analysis can be used to categorized and recognize a set of topological conflict patterns for which conflict resolution solutions may be associated, empirically or otherwise. This topological pattern analysis pinpoints the location within the layout where the conflict occurs and where corrections to the layout should be made to resolve the conflict.

The cost of resolving each type of conflict may be taken into consideration, for example, by using layout slack. Conflicts may be resolved by any of a variety of methods, including, for example, widening of a region of a critical shape segment or the entire critical shape segment, or merging or splitting of adjacent phase shapes. The conflict resolution solution selected results in a set of layout constraints that will ensure the legality of the layout at the location of the identified conflict.

The layout may then be legalized in accordance with the layout constraints, preferably using a minimum perturbation criterion (see, for example, Heng et al., "A VLSI Artwork Legalization Technique Based on a New Criterion of Minimum Layout Perturbation," in Proceedings, 1997 International Symposium on Physical Design (Apr. 14–16, 1997), pp. 116–121) or other cost analysis criteria. Since more than one method of resolving a local conflict may be applicable, a set of legalized layouts may be produced. Note that not all local conflict resolution solutions will necessarily result in a legal layout. Among the set of legalized layouts, the most economical one is preferably chosen, based on factors such as area (i.e. slack), deviation from the original layout, and the manufacturability of the layout, among other possible factors.

BRIEF DESCRIPTION OF THE DRAWINGS

FIGS. 9A–9F illustrates a design layout having different classifications of layout violations.

DESCRIPTION OF THE PREFERRED EMBODIMENTS

In the following descriptions of the preferred embodiments of the invention, a method is described for optimizing VLSI layout designs for resolution enhancement techniques (RETs). Reference is made to the drawings to illustrate the method according to the resent invention, which are not necessarily drawn to scale.

In accordance with the present invention, global optimization of VLSI layout designs is achieved by constructing a graphical representation of the topological relationship between critical design features and RET features, and using pattern analysis of the graphical representation in order to generate a manageable-sized set of legal design alternatives.

The method in accordance with the present invention is illustrated below by applying the method to examples of alternating phase shift mask (altPSM) design, but are not limited to those specific examples, and is applicable to other layout optimizations where the shape spatial relationships may be expressed in a planar graph representation.

In the case of a bright-field altPSM design, the goal is to produce an altPSM layout that is conflict-free, optimized and legalized. In accordance with the present invention, the altPSM design is first represented in graphical form by defining graph nodes having characteristics associated with key characteristics of the design element shapes.

Figure 4:
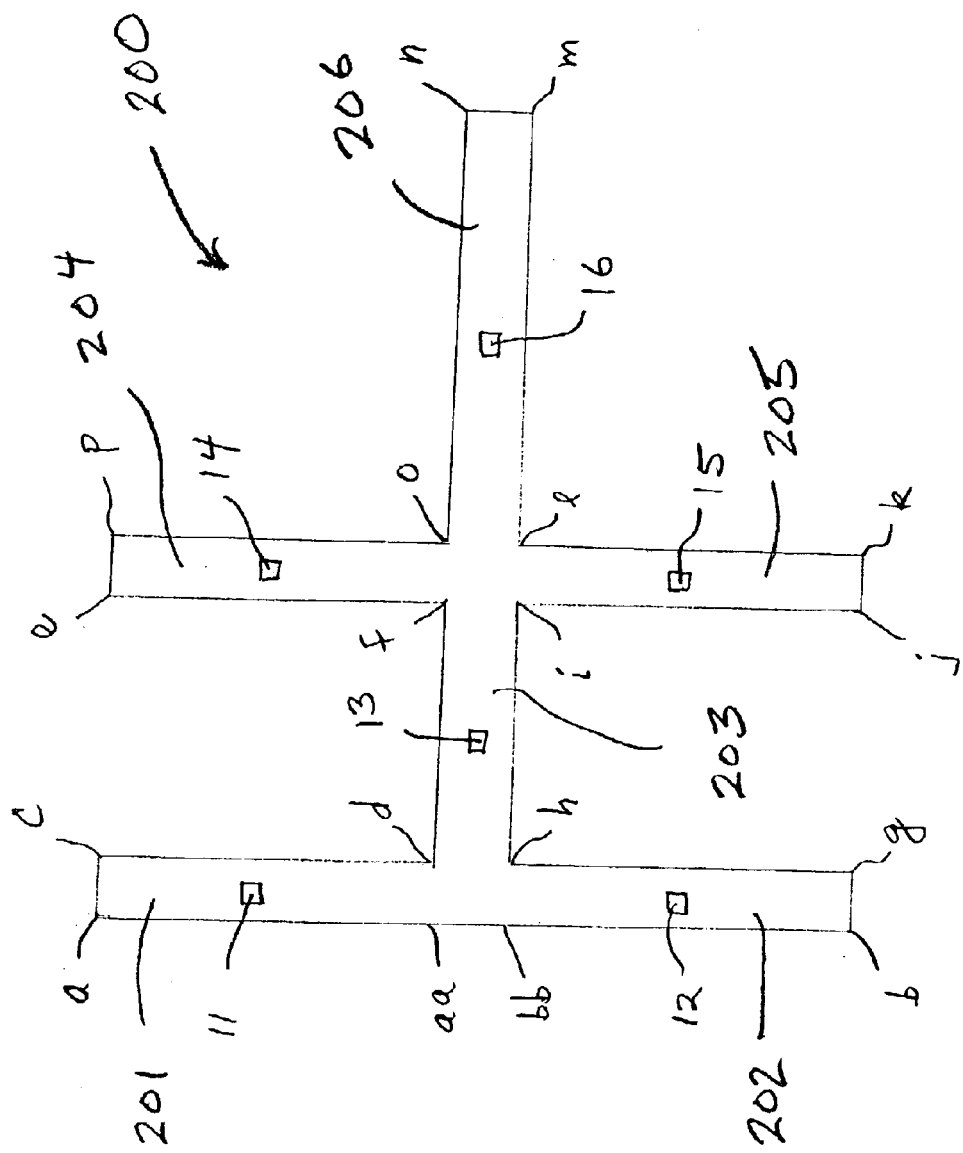
FIG. 4 illustrates a design layout having critical elements including assigned critical feature nodes.

As an example, referring to FIG. 4, consider the design layout 200 having four vertically oriented elements 201, 202, 205 and 204 with critical features 201, 204 pointing up and critical features 202, 205 pointed down. The vertical elements are connected to two horizontal elements 203 and 206 that also have critical dimensions. The relative relationship of these critical design elements can be represented by Feature Graph Nodes. The location of feature graph nodes may be assigned, for example, by placing nodes on the medial axis of each of the critical design features. The medial axes may be determined by constructing an internal Voronoi diagram of the design feature polygons. In this example, vertical elements 201, 202, 203 and 204 are represented by vertical feature graph nodes 11, 12, 15 and 14, respectively. Similarly, horizontal elements 203 and 206 are represented by horizontal feature graph nodes 13 and 16, respectively. Stated another way, the feature graph nodes 11, 12, 14 and 15 have the characteristics that they represent the location of critical design elements and they also have a vertical orientation. Similarly, feature graph nodes 13 and 16 represent critical design elements that are characterized by having a horizontal orientation. Other orientations, not shown in this example, may also be assigned to a feature graph node, for example, corresponding to a critical element oriented at a 45° angle.

In addition to orientation, the feature graph nodes may be assigned other associated characteristics, such as "expandability," or "segmentability." For example, a critical segment may be designated as expandable (that is, it can be widened) if it is not part of a gate structure, but non-expandable if it is part of a gate. This assigned characteristic may be used later if potential graph conflicts and violations are found, and identifying critical segments where such conflicts or violations may be resolved by widening an expandable critical element so as to eliminate the potential conflict or rule violation (which results in removing that feature graph node from the interlock graph). Additionally, a critical segment may be designated as segmentable if it includes more than one gate. Here, the segmentable critical segment may be sub-divided into individual segments that include a gate as well as a segment that does not include a gate, and would therefore be expandable, and could be widened to remove a conflict if called for by the graph analysis.

In this example, the element 201 has a critical dimension that is the width of element 201 between the edge segments a-aa and c-d, hereinafter referred to as critical edges for convenience. Similarly, element 202 has a critical dimension characterized by critical edges b-bb and g-h; element 203 has critical edges d-f and h-i; element 204 has critical edges e-f and p-o; element 205 has critical edges i-j and l-k; and element 206 has critical edges o-n and l-m. In the altPSM layout, each critical dimension must have associated a phase shifting shapes disposed on opposing sides of the element along the critical edges and having opposite polarity (e.g. 0° on one side and 180° on the other side). Thus, the existence of the required phase shapes is represented by designating a phase shape representor associated with the critical edges of each critical design element. For example, a phase representor a-aa is assigned along the a-aa edge of element 201 and another phase representor c-d along the opposite edge c-d of element 201. The goal, in accordance with the present invention, is to create a phase interlock graph that captures the topological interlock between phase shapes, but does not predetermine the size or shape of phase shapes based on their proximity.

Figure 5:
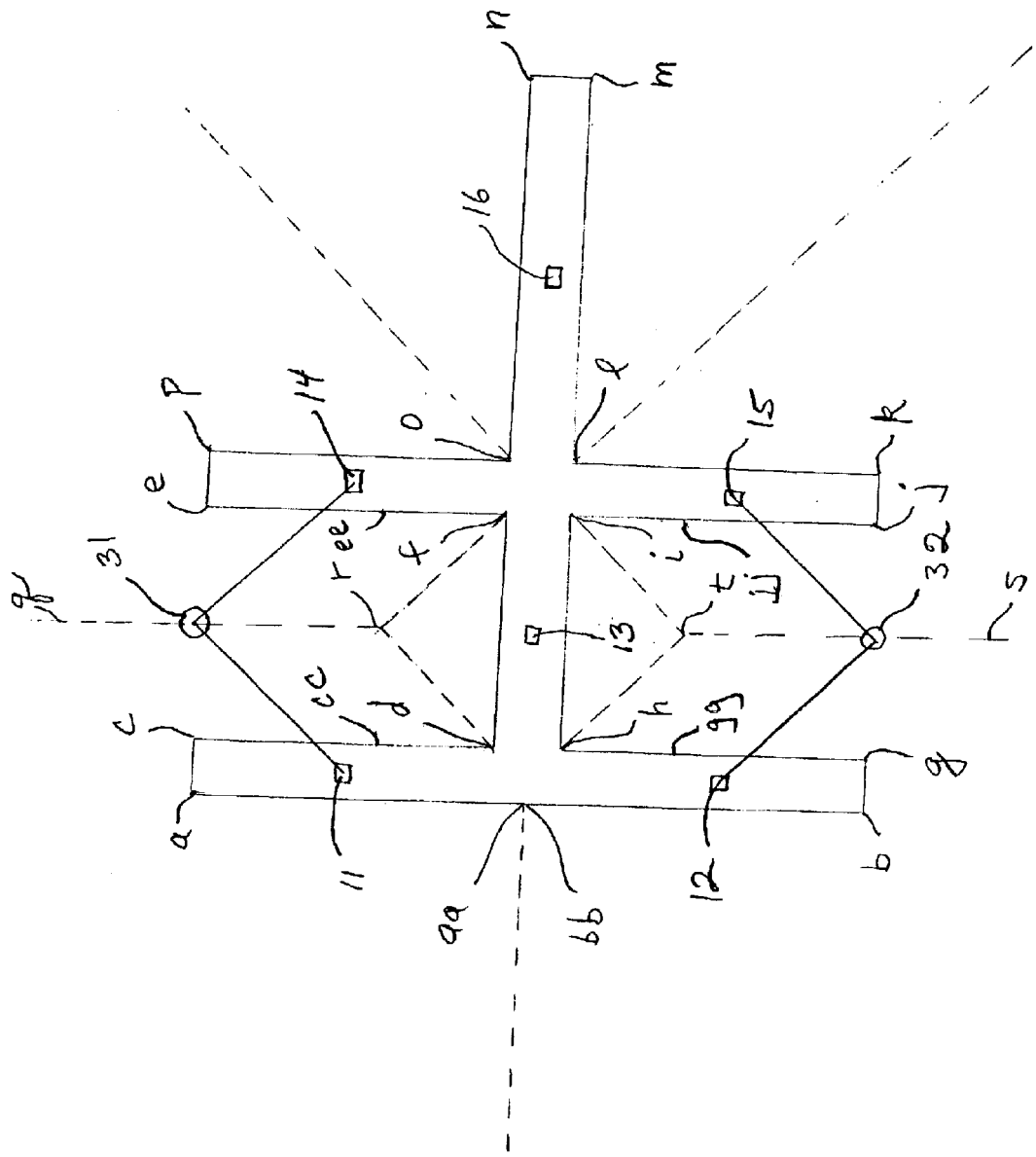
FIG. 5 illustrates a design layout having critical elements including assigned critical feature nodes and soft connection nodes.

Next, referring to FIG. 5, "connection nodes" are defined which captures adjacency relationships between the phase representors. A connection node is assigned where there is potential interaction between phase shapes, i.e., an adjacency relationship or a phase interaction relationship. The assignment of a connection node expresses the possibility that the two adjacent phase shapes may be merged along their corresponding adjacent edges in the final altPSM layout. The adjacency relationship may be expressed by determining bisectors between adjacent edges of phase representors. For example, one effective method of constructing such bisectors is to construct a Voronoi diagram which is exterior to the polygons of the critical design features. The Voronoi diagram is used to ensure the planarity of the phase interlock diagram, but other methods of ensuring the planarity of the graph may be used. Graph nodes are assigned along the bisectors between phase representors that are not directly connected to each other, but may interact with each other. Such graph nodes are designated as Soft Connection Nodes. Nominally, adjacent phase shape edges represented by a soft connection node would be merged in the altPSM layout. The phase relationship is "soft" in the sense that the interaction between such adjacent phase shapes may be manipulated by merging or splitting phase shapes, dependent on the spacing constraints to be applied to the adjacent critical elements 201 and 204. In this example, the bisector r-q represents the interaction of unconnected phase representors between edges c-cc and e-ee that are not directly connected. Therefore, soft connection node 31 is assigned along bisector r-q. The exact location along r-q is not critical, but must lie on the bisector, which ensures that the resulting graph will be planar. Similarly, a soft connection node 32 is assigned along the bisector t-s between unconnected phase representors g-gg and j-jj. Graph edges are created by connecting adjacent feature nodes to the soft connections nodes, as indicated in FIG. 5 between feature node 11, soft connection node 31 and feature node 14. Similarly, graph connections are made between nodes 12, 32 and 15.

Figure 6:
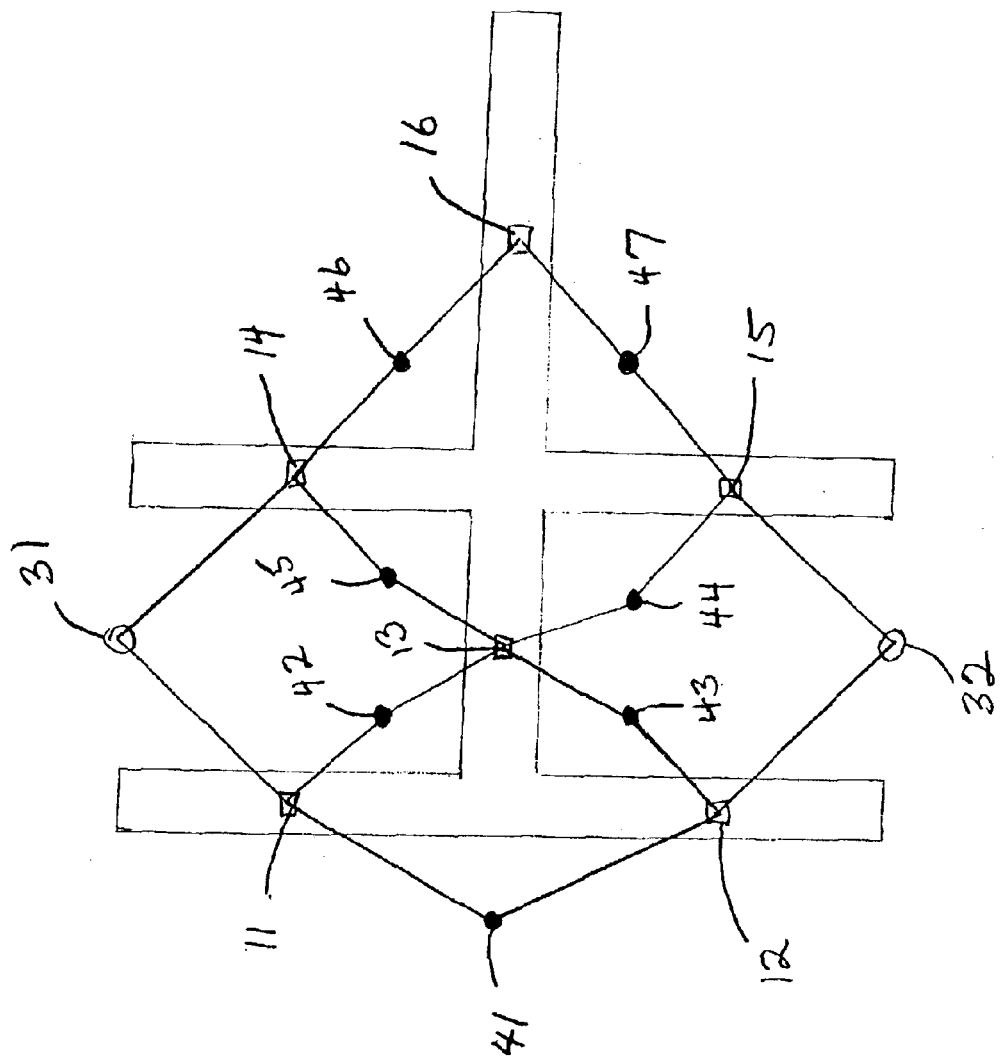
FIG. 6 illustrates a design layout having critical elements including assigned critical feature nodes, soft connection nodes and hard connection nodes.

Next, the relationship between directly connected phase representors is captured by assigning Hard Connection Nodes between phase representors that are directly connected. For example, the bisector d-r between phase shape representors c-d and d-f describes the relationship between edge segments that are directly connected at intersection d, and that direct connection between phase representors c-d and d-f corresponds to connected critical elements 201 and 203. This relationship between connected phase shapes will not be broken unless one of elements 201 or 203 is no longer a critical element, and this behavior is captured by assigning a Hard Connection Node, positioned along the bisector d-r. Again, the use of the bisector to position the hard connection node ensures that the graph will be planar. Note that a bisector may be constructed between phase representors along edge segments a-aa and b-bb which lie along a common edge a-b. This bisector would not arise from construction of a Voronoi diagram, but is constructed separately to express the adjacency relationship between the two external phase representors along edges a-aa and b-bb. The resulting graph connecting hard connection nodes 41, 42, 43, 44, 45, 46 and 47 to adjacent feature nodes is shown in FIG. 6.

Figure 7B:
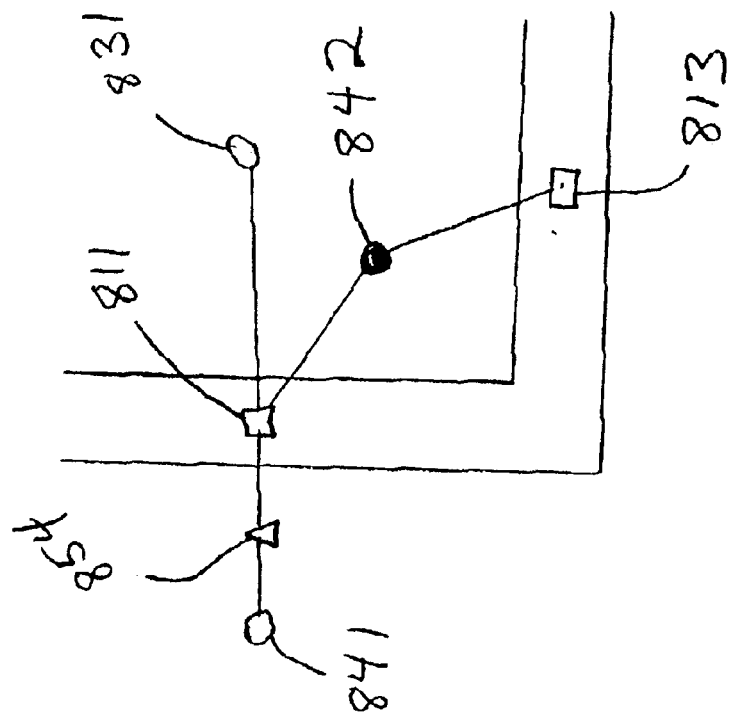
FIGS. 7A–7B illustrates examples of design layouts having critical elements including assigned critical feature nodes, connection nodes and auxiliary nodes.
Figure 7A:
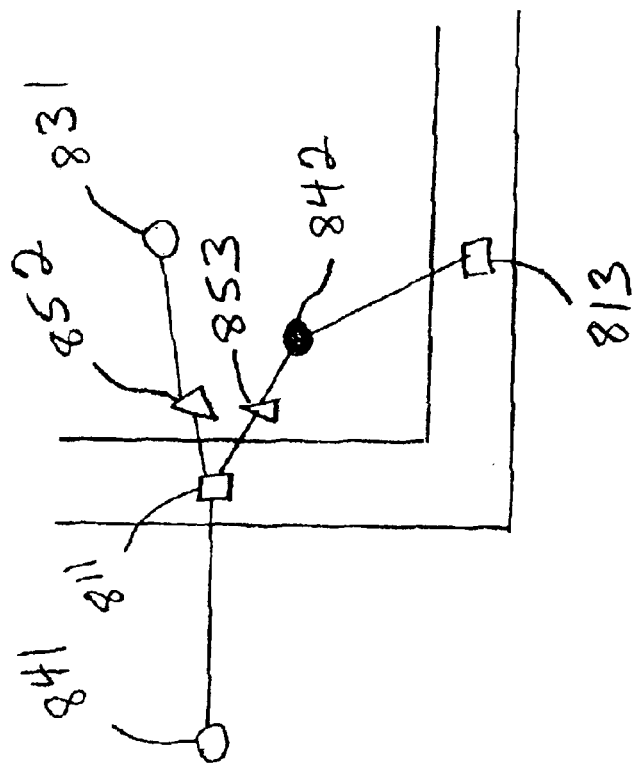

The phase interlock graph is completed by adding a node that represents the requirement of altPSM layouts that every critical element is associated with a pair of opposing phase shapes of opposite polarity. To capture this requirement, Auxilliary Nodes are positioned on either side of a critical feature element along the graph connection between the associated feature node and all the connection nodes (hard and soft) on that (arbitrarily) selected side. For example, FIG. 7A illustrates the case of a feature node 811 having connections to a soft connection node 841 on the left, and a soft connection node 831 on the right and a hard connection node 842 also on the right. Since the hard and soft connection nodes represent phase shapes, the connections nodes have the requirement that connection nodes on opposing sides of a critical element have opposite polarity. This requirement can be captured by adding auxilliary nodes 852 and 853 to the connections on the right-hand side of feature node 811. Thus, if polarity is alternatively assigned to each node, opposite polarity of phase shapes (represented by a connection node) will be enforced across every critical element. Thus, the addition of auxilliary nodes provides a simple counting scheme for capturing phase conflicts, for example, due to odd-even runs of elements and phase shapes. The placement of auxilliary nodes in a particular connection direction from a feature node is arbitrary, as long as all connections on a given edge of a critical element are treated similarly. For example, placing an auxilliary node between the feature node 811 and soft connection node 841, but deleting auxilliary nodes 852 and 853 as in FIG. 7B would have the same desired effect.

Figure 8A:
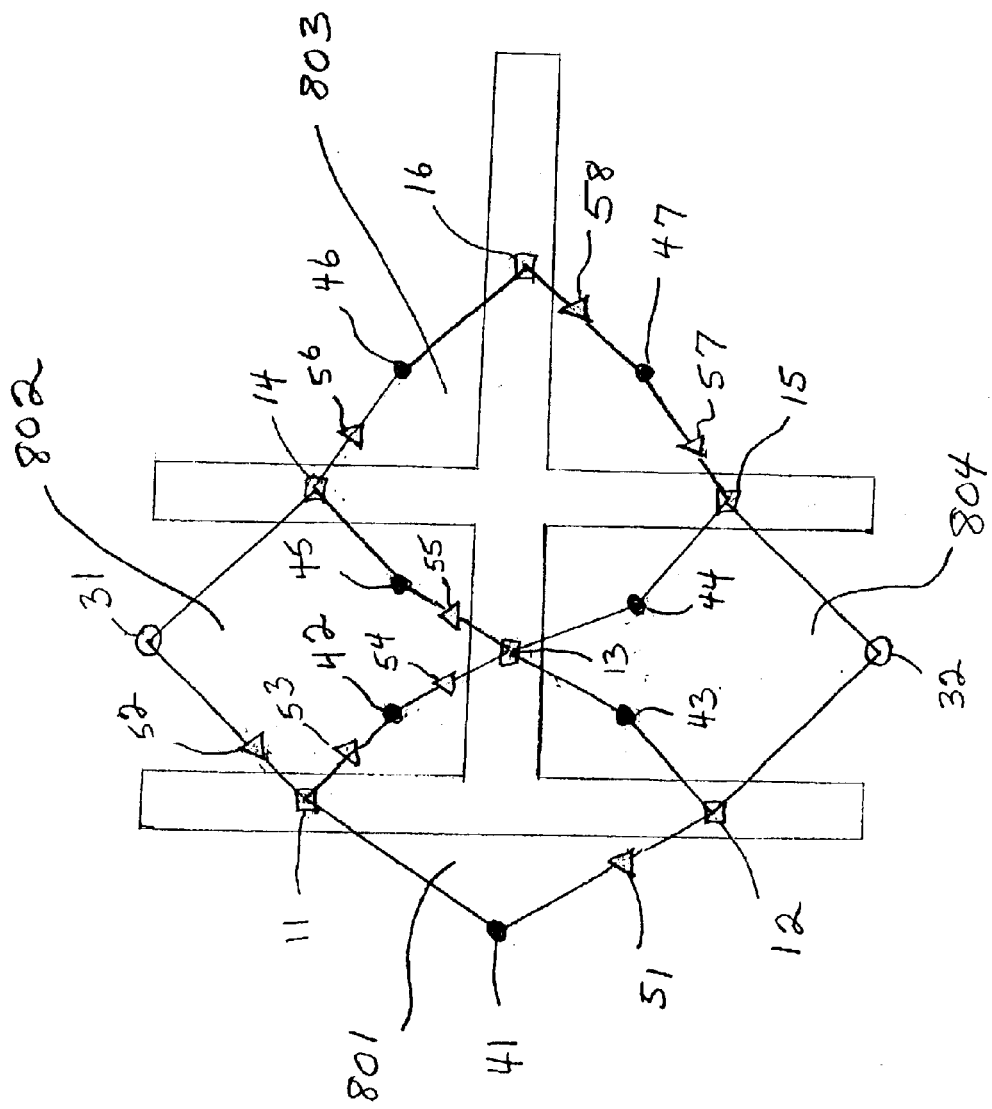
FIG. 8A illustrates a design layout having critical elements including assigned critical feature nodes, hard and soft connection nodes and auxilliary nodes.

The resulting phase interlock graph including auxiliary nodes, is shown in FIG. 8A. Because the graph is planar, there are no intersecting lines that are not connected by a node. Closed loops of connected nodes, referred to as "faces," can be identified, and classified according the number and character of the nodes making up the face, thus providing a classification of critical elements and phase shape relationships which can be examined quickly to identify regions of the layout where design violations may exist. In the example of FIG. 8A, there are four faces 801, 802, 803 and 804. The number of nodes within faces 802, 803 and 804 are even, which indicates that there are no phase conflict violations in those regions of the layout. In other words, phase polarity assignments can be made that are conflict-free. However, face 801 has an odd number of nodes, indicating that there is no legal assignment of phase polarity that satisfy the binary assignment of polarities across each critical element associated with the nodes of face 801. Thus, the graph automatically identifies an region of the layout that requires modification in order to arrive at a conflict-free, legalized layout.

Thus, the phase interlock graph can be analyzed topologically to identify patterns that indicate the existence of layout conflicts. Known topological conflict patterns (i.e. faces of a planar graph) can be classified and associated with known conflict resolution solutions, which may be empirically determined methods for resolving those design conflicts. For example, the face 801 identified in FIG. 8A can be recognized as describing a "T-junction" conflict pattern, and pin-pointed to specific locations in the design layout. Once the T-junction conflict is recognized at the location of face 801, known conflict resolution rules or layout constraints can be applied to resolve and remove the conflict in that portion of the design. Such constraints can be defined for both the design layout features and/or phase shapes. Then the phase interlock graph can be updated until no conflicts remain, and the entire conflict-free layout can be legalized. In addition, since there may be more than one way to resolve the conflict for a given violation, a finite set of constraints can be generated to guarantee resolution of the conflict. Application of that set of constraints can be applied (for example, in block 430 of FIG. 1) to generate a set of legalized layouts, which can be compared using a cost analysis to obtain a cost-optimized conflict-free layout solution.

Examples of classifications of conflict types for the case of bright field altPSM designs are provided in the following discussion, with reference to FIGS. 9A–9F.

Figure 9A:
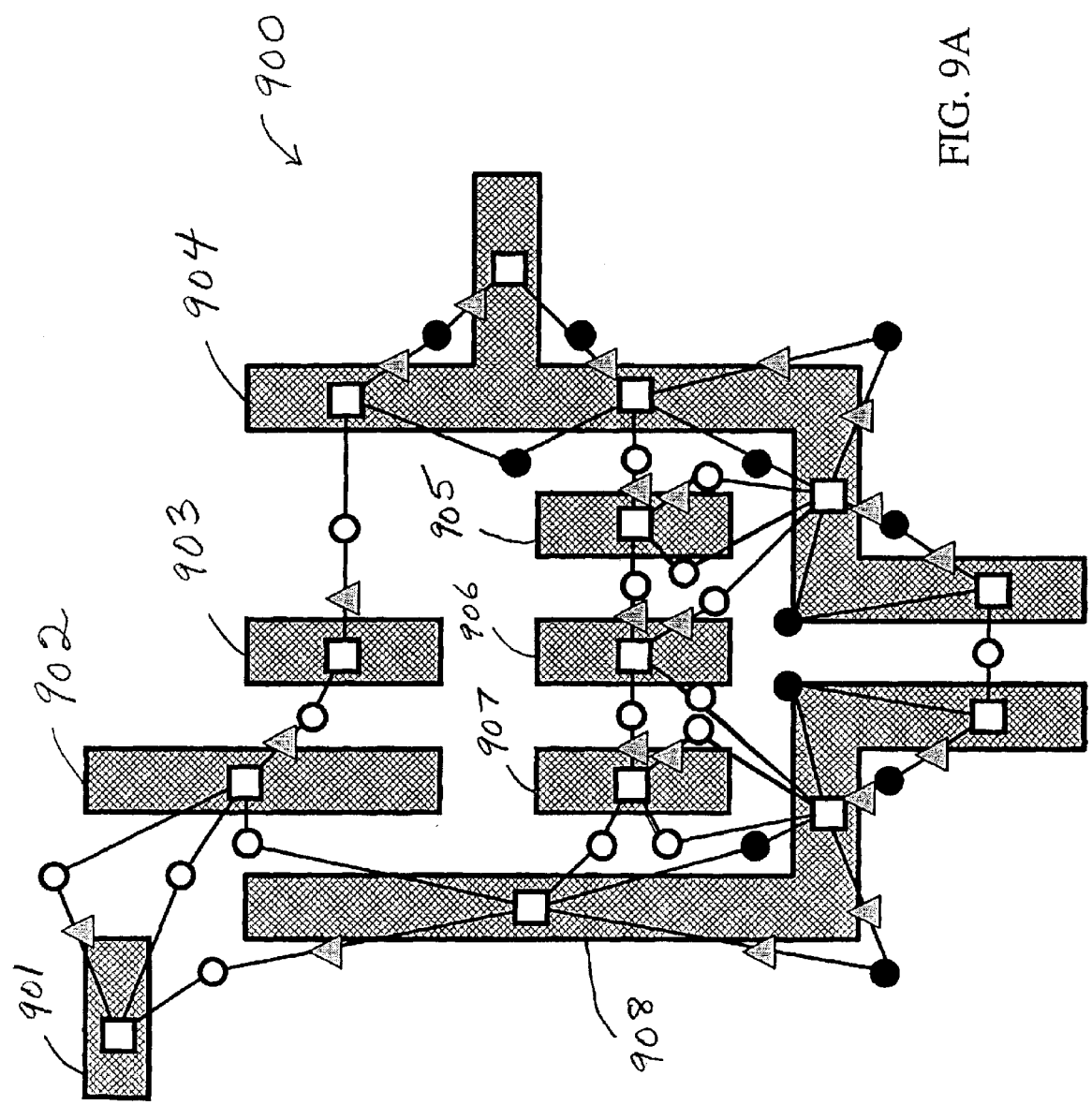

FIG. 9A illustrates a design layout 900 having feature elements 901–908 for which a phase interlock graph has been constructed in accordance with the present invention. The open squares indicate Feature graph nodes; open circles indicate Soft Connection nodes; filled circles indicate Hard Connection nodes; and trianges indicate Auxiliary nodes.

Figure 9B:
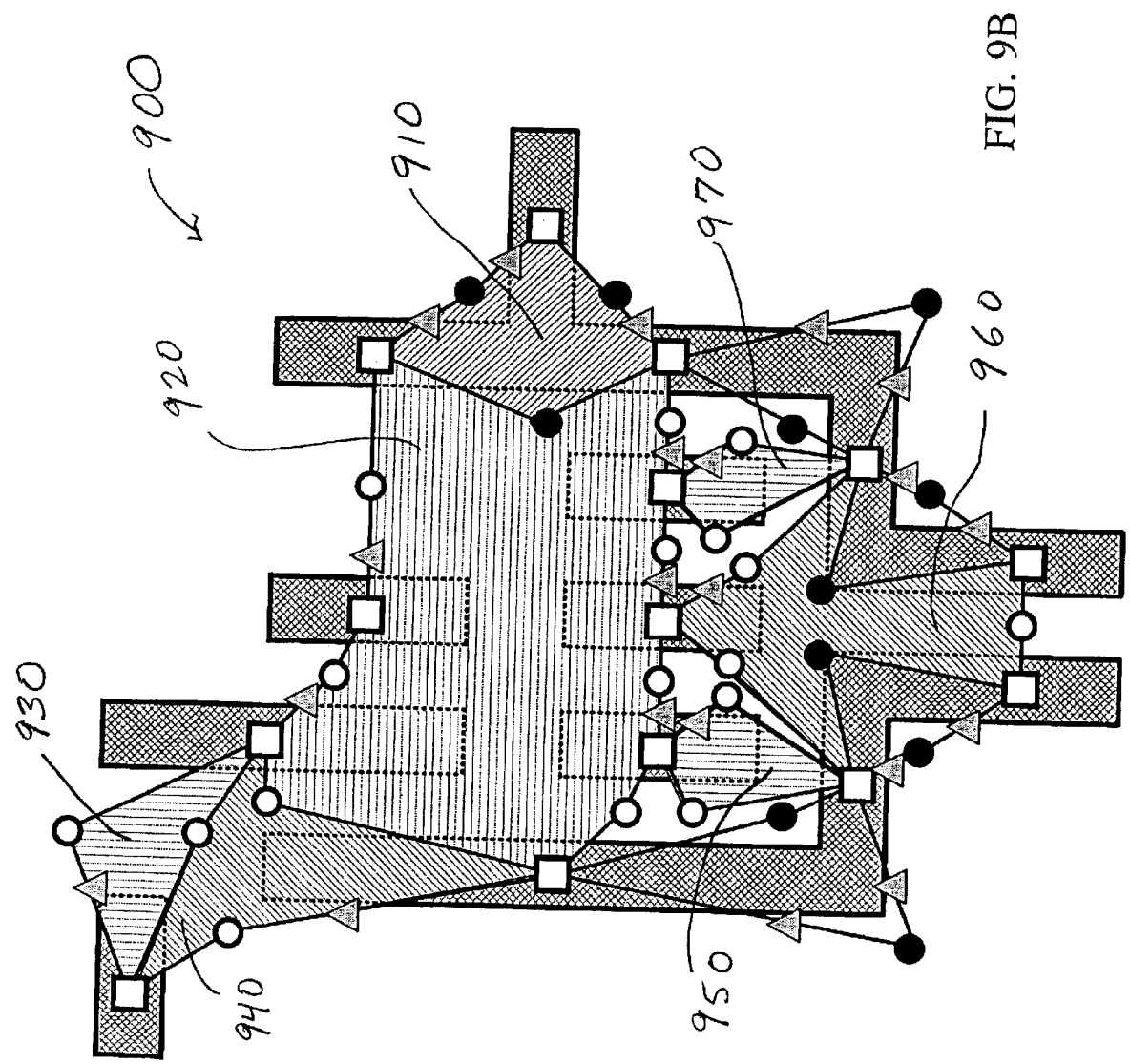

Conflict faces 910, 920, 930, 940, 950, 960 and 970, which are defined by odd numbers of nodes, are highlighted as cross-hatched areas in FIG. 9B. The odd numbers of nodes of these faces are indicative of various design conflicts. These faces and their associated conflicts can be categorized along with their associated conflict resolution strategies as discussed below.

Figure 9C:
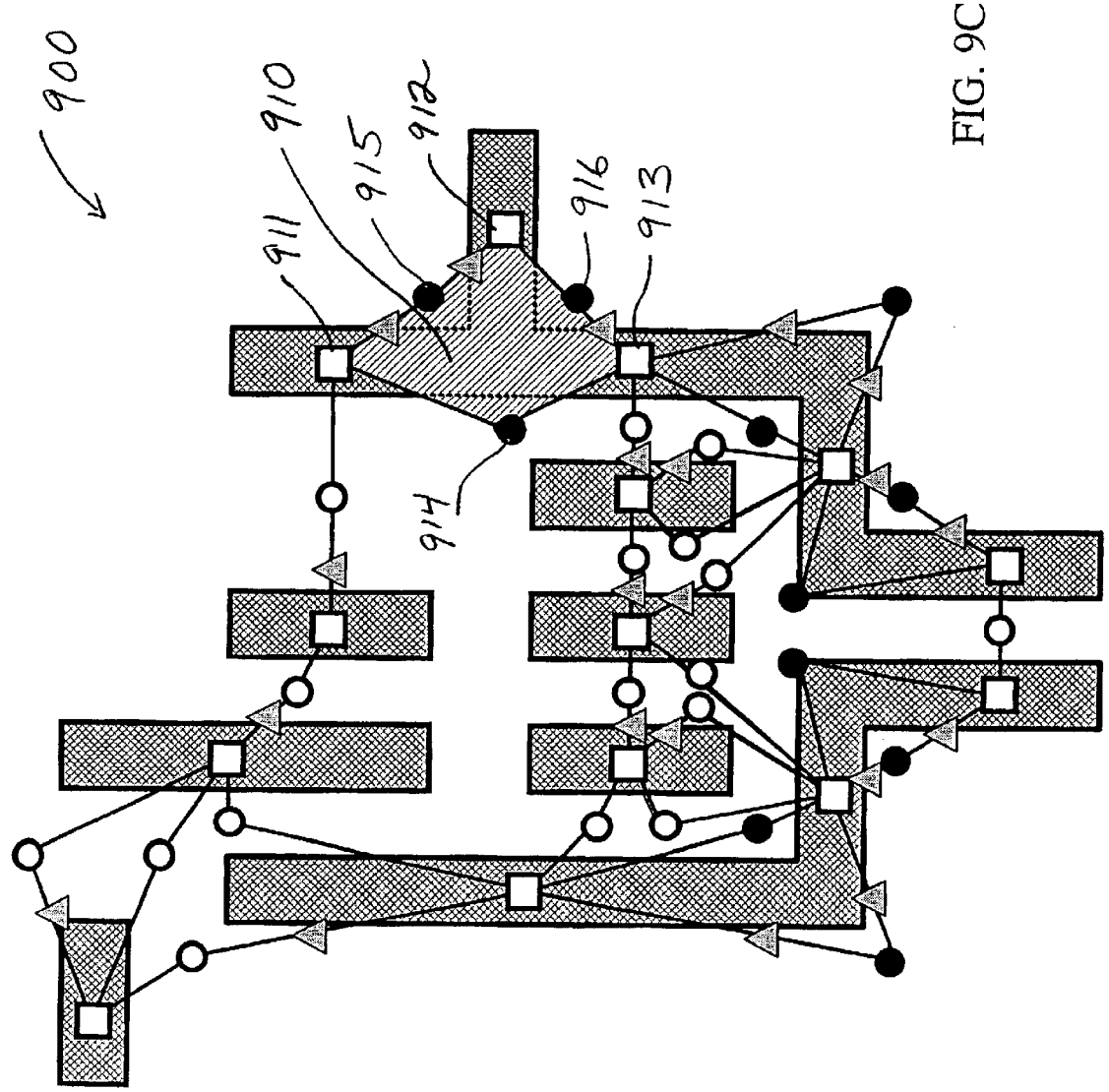
Figure 9D:
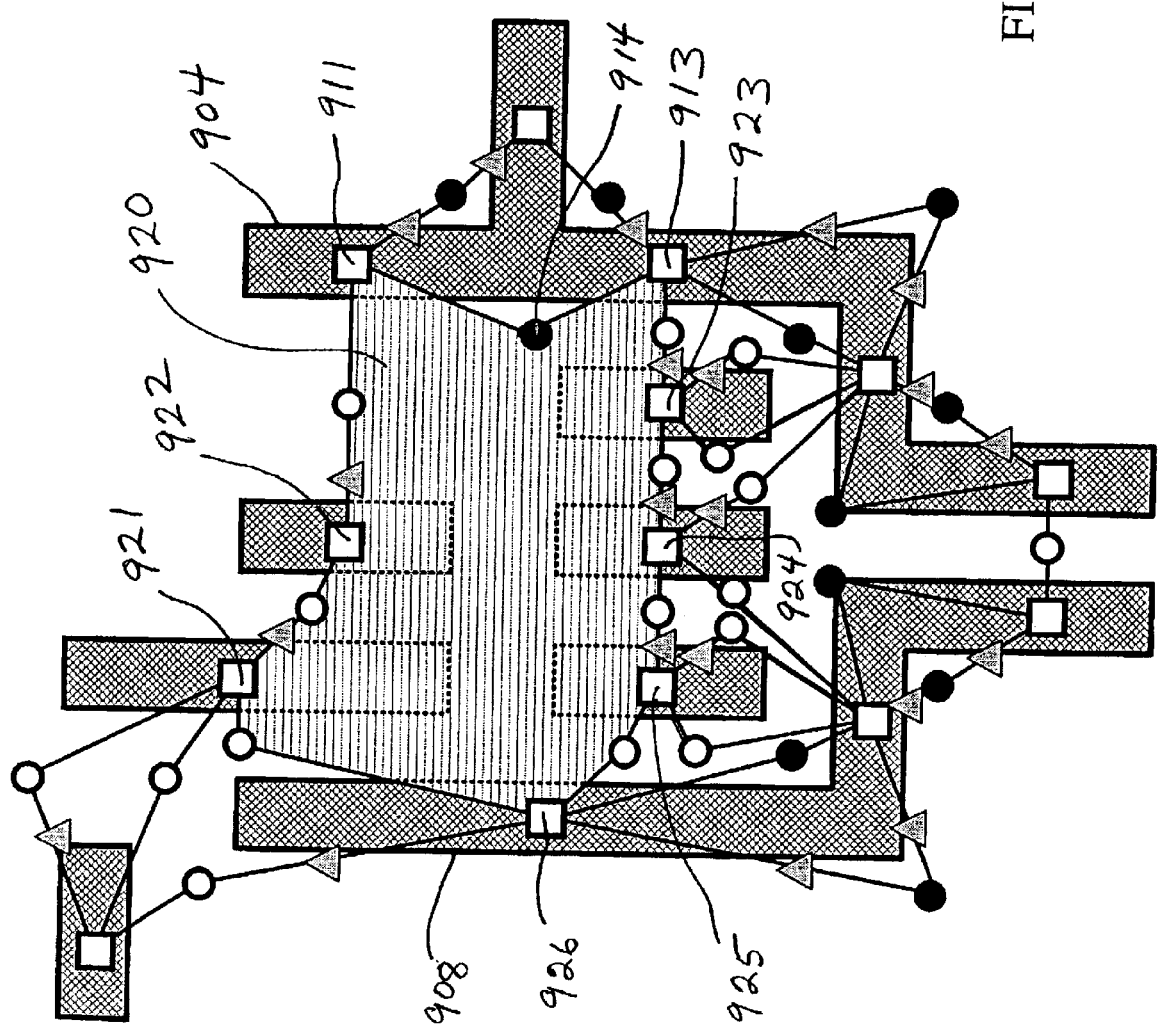

A T-junction conflict is illustrated by reference to FIG. 9C. A T-junction conflict is characterized by a face such as face 910 which has 3 feature graph nodes 911, 912 and 913, in which two of feature nodes, namely 911 and 913 in this example, have the same orientation which is different than the orientation of the third feature node 912. The connection nodes are only hard connection nodes 914, 915 and 916 (that is, there are no soft connection nodes). Having identified a T-junction conflict, pre-defined conflict resolution rules and constraints may then be applied in legalization step 430 (FIGS. 1 and 10) to remove the conflict. Removal of the feature node associated with the expanded critical segment from the phase interlock graph operates to generate a layout constraint for legalizing the T-junction and removes T-junction conflict pattern from the graph. For example, if a critical feature is expandable, and if the layout slack permits it, the critical segment may be constrained to be widened so that the segment is no longer critical. An example application of this is discussed in more detail below.

An Odd-Even Run is indicated by a face 920 that contains feature nodes (i.e. 921, 922, 911, 913, 923, 924, 925 and 926) all having the same orientation, which is vertical in this example. An odd-even run is characterized by a face having two edge disjoint paths. In this example, the upper path contains feature nodes 926, 921, 922 and 911 which run sequentially in a direction orthogonal to the orientation of the feature nodes. The upper path is edge disjoint from the lower path containing nodes 926, 925, 924, 923 and 913, since the upper and lower paths do not share a common path edge. Each disjoint path does not contain a hard connection node, but the face 920 is completed by hard connection node 914 between feature nodes 911 and 913.

Figure 1:
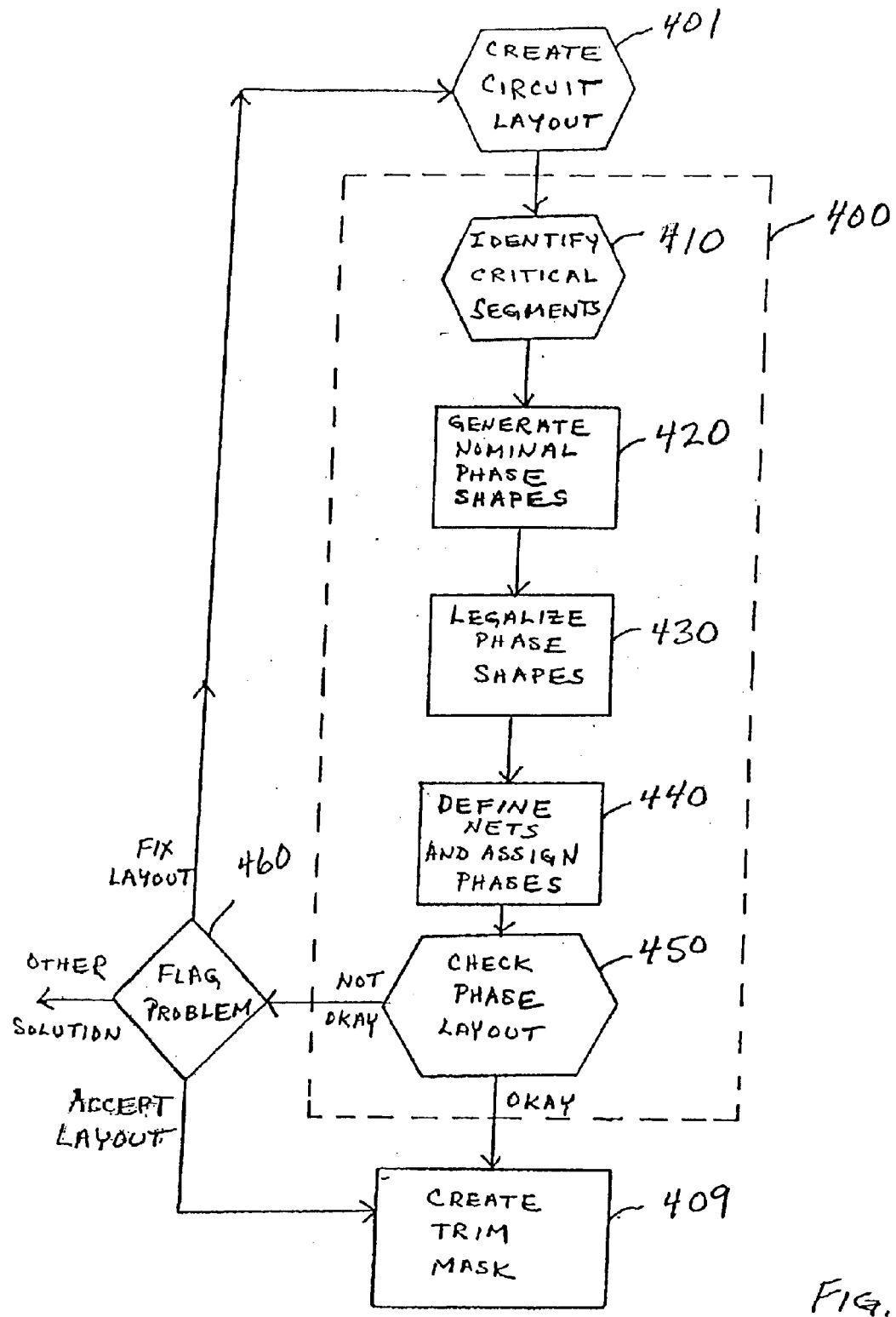
FIG. 1 illustrates a flow chart of a prior art method for layout optimization of an alternating phase shift mask design.
Figure 2:
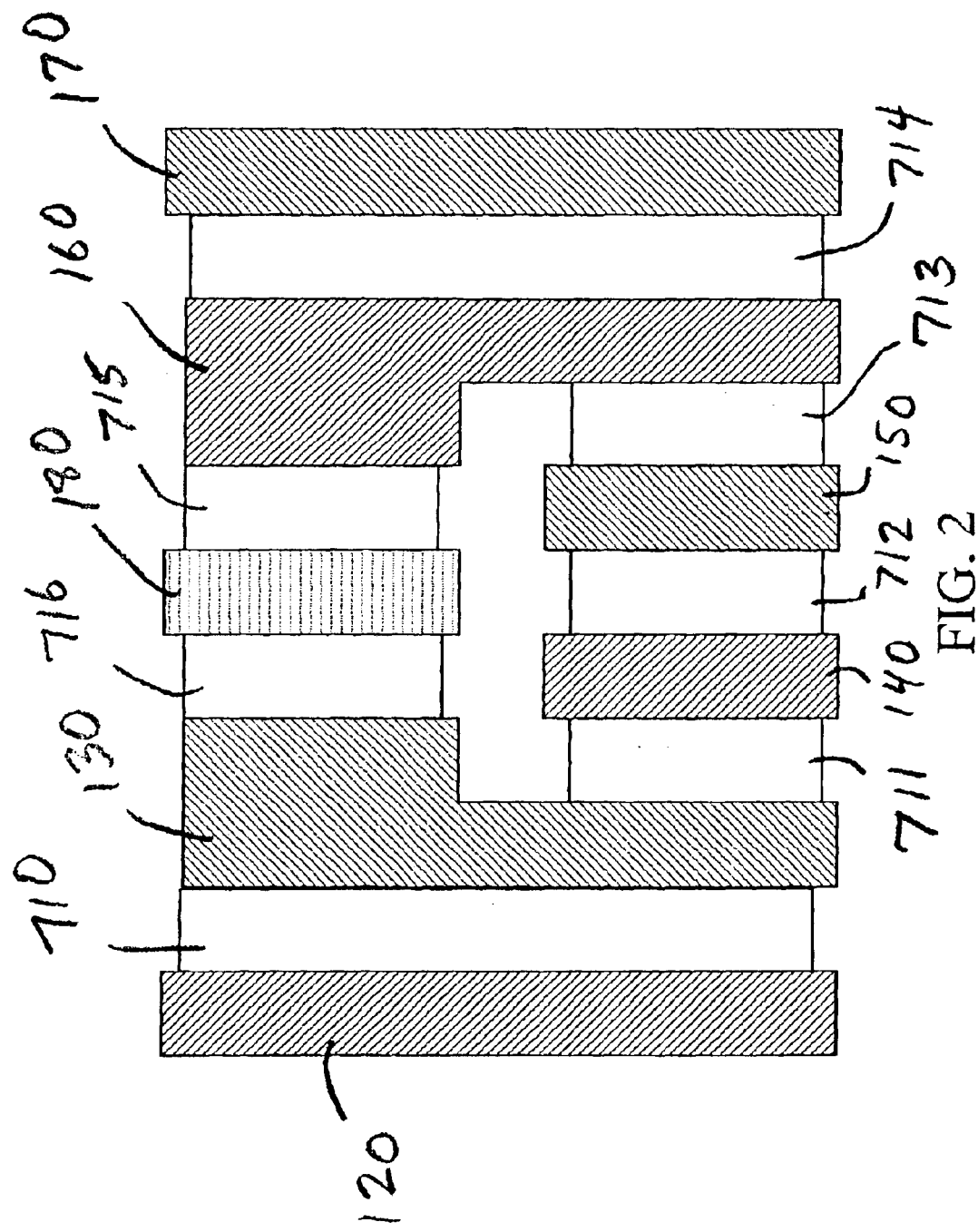
FIG. 2 illustrates an example of a design layout exhibiting an odd-even run.
Figure 10:
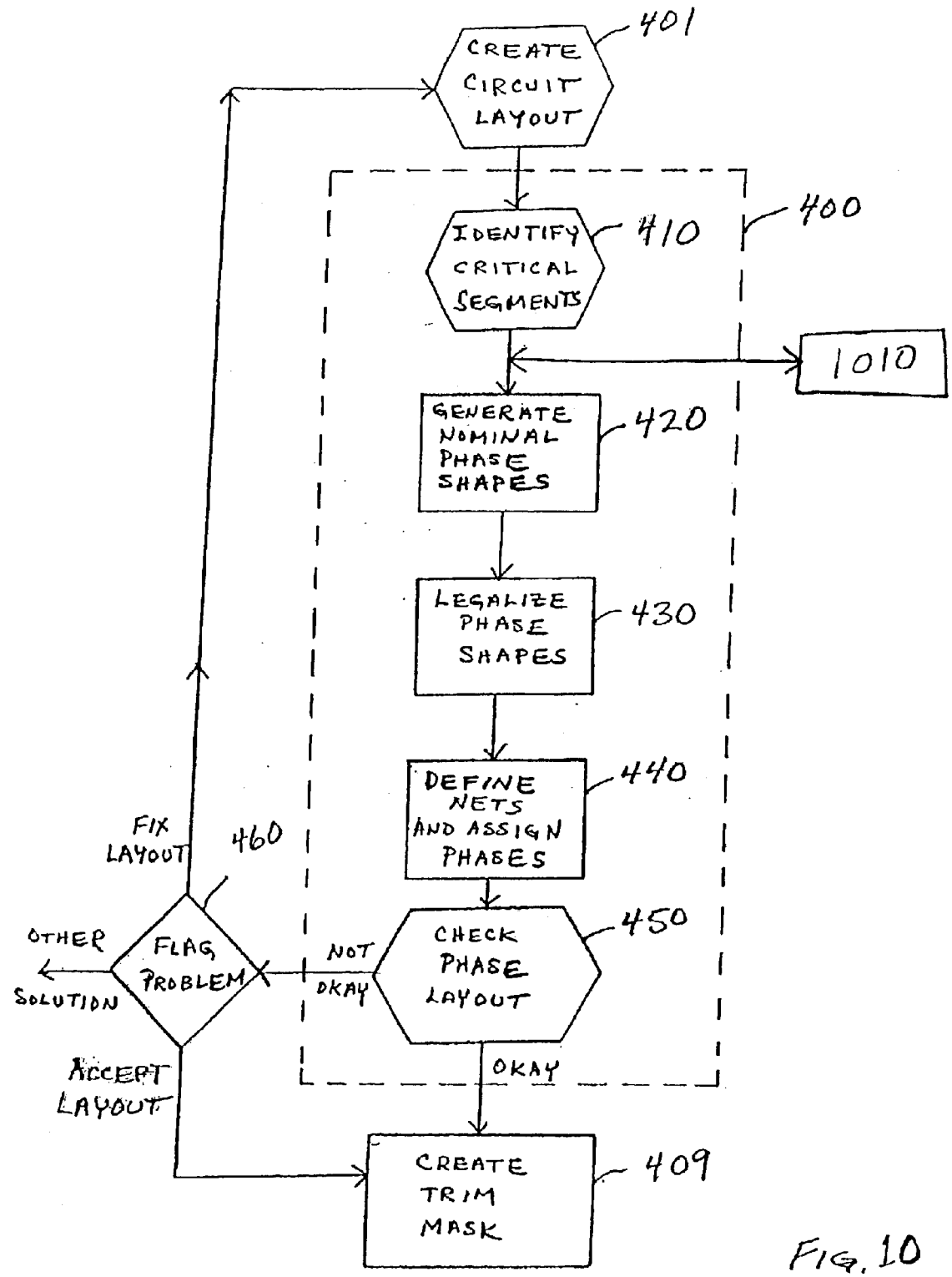
FIGS. 10–11 illustrates a flow chart for designing an altPSM in accordance with the present invention.

The resolution of a odd-even run conflict may be obtained, for example, by first analyzing the layout slack on the shorter (that is, containing the fewer number of feature nodes) of the two disjoint paths, from the feature node at one extreme of the path to the other extreme feature node of the path. If there is sufficient slack available in the layout, the conflict may be resolved by deleting a soft connection at a suitable location in the middle of the shorter disjoint path. The deletion of the soft connection node will be accompanied by the generation of a set of layout constraints to be applied to that layout location during the legalization step 430 (FIGS. 1 and 10). If the estimated cost of this solution to resolving the conflict is higher then a threshold value, then an alternate solution can be considered. For example, in a second alternate solution, split one of the extreme critical segments 904, 908 into 3 segments, using the layout slack to determine which of the two extreme critical segments to split, and then widen the middle segment to remove the connection between the edge disjoint paths. Either of these solutions will remove the odd-even run from the layout, and therefore at least two conflict-free layouts may be generated. The preferred solution will be chosen based on predetermined priority and cost, such as the estimated cost of legalization.

Line-end conflicts are indicated by faces 930, 950 and 970 as illustrated in FIG. 9E. A face indicating a line-end conflict is characterized by two feature nodes having different orientations, and containing only soft connection nodes. A line-end conflict may be resolved, for example, by any of the following: 1) if one of the feature nodes represents an expandable critical segment, the segment may be expanded (i.e. widened) if there is sufficient slack in the layout, which has the effect of deleting the associated critical feature node; 2) create a feature at the line end (e.g. a hammerhead feature or a landing pad feature) which adds width and/or length to the line end that increases the spacing and effectively breaks the interaction between the two phase representors of the line end and the adjacent perpendicular phase representor, thus deleting those soft connection nodes; or 3) increase the spacing between a critical line end and the adjacent critical line, assuming there is sufficient layout slack, so that the interacting phase shape edges no longer interact. Removal of a soft-connection node generates appropriate layout constraints for options 1), 2) or 3), to be applied during the legalization step 430 (FIGS. 1 and 10). The priority of applying options 1), 2) or 3) would typically be based on empirical experience, and can be tuned depending on the input data.

Figure 9F:
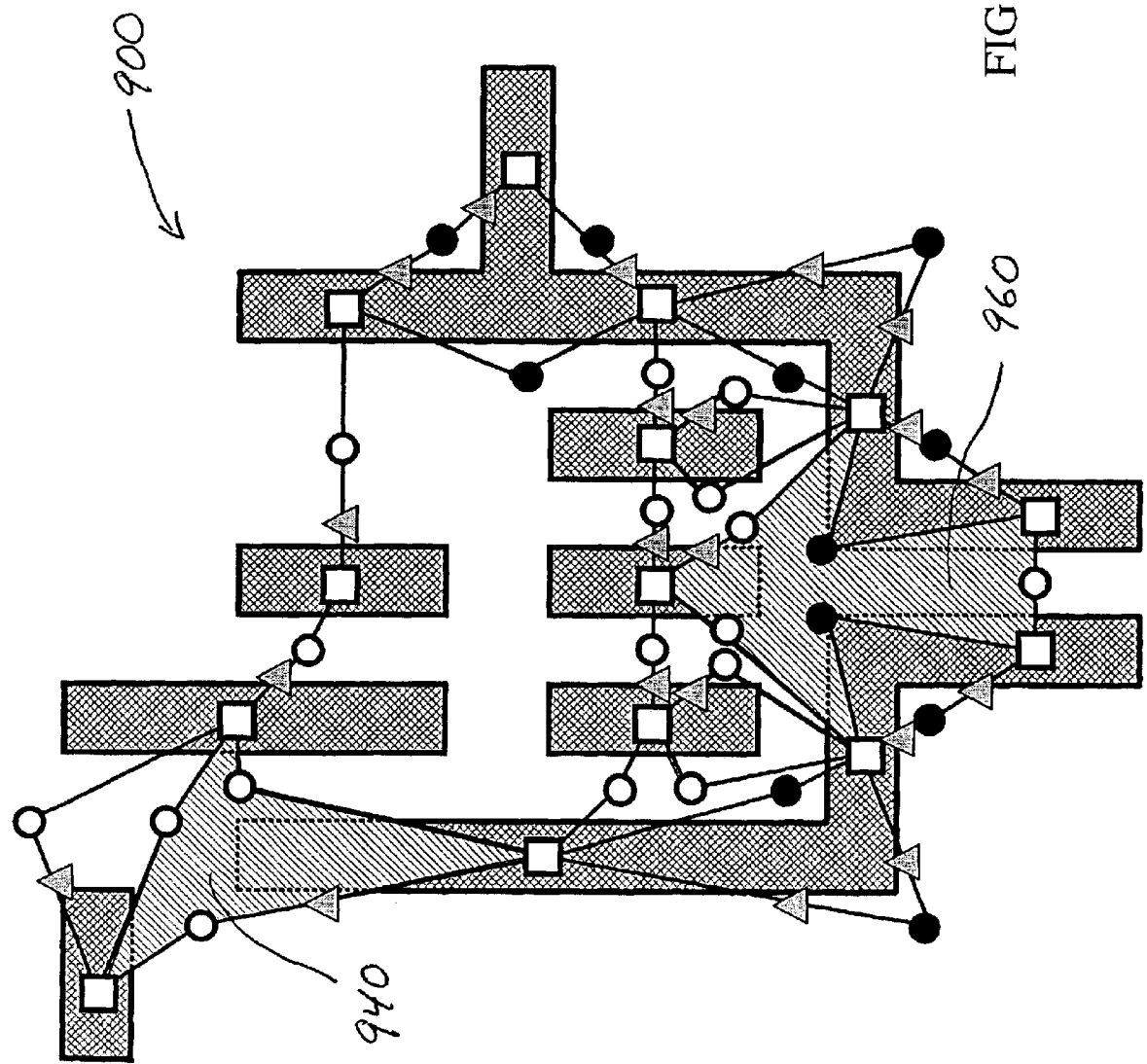

Bad critical segments are identified by faces that have three or more feature nodes which have at least two different orientations, for example faces 940 and 960 as illustrated in FIG. 9F. Resolution of such conflicts may be achieved, for example, by deleting a feature node, and expanding (i.e. widening) an expandable critical element in the direction of greatest layout slack, or if there are no expandable critical elements, then deleting a soft connection node by sufficiently increasing the spacing between critical elements. The corresponding layout constraints are applied to those elements during legalization 430 (FIGS. 1 and 10).

Once again, alternative solutions for conflict resolution may be generated, resulting in a set of conflict-free layouts. The number of such sets can be kept to a reasonable finite number by applying criteria such as minimum perturbation criteria and cost optimization analysis. The resulting set of conflict-free altPSM design layouts can be legalized, as for example, by known methods.

Figure 8B:
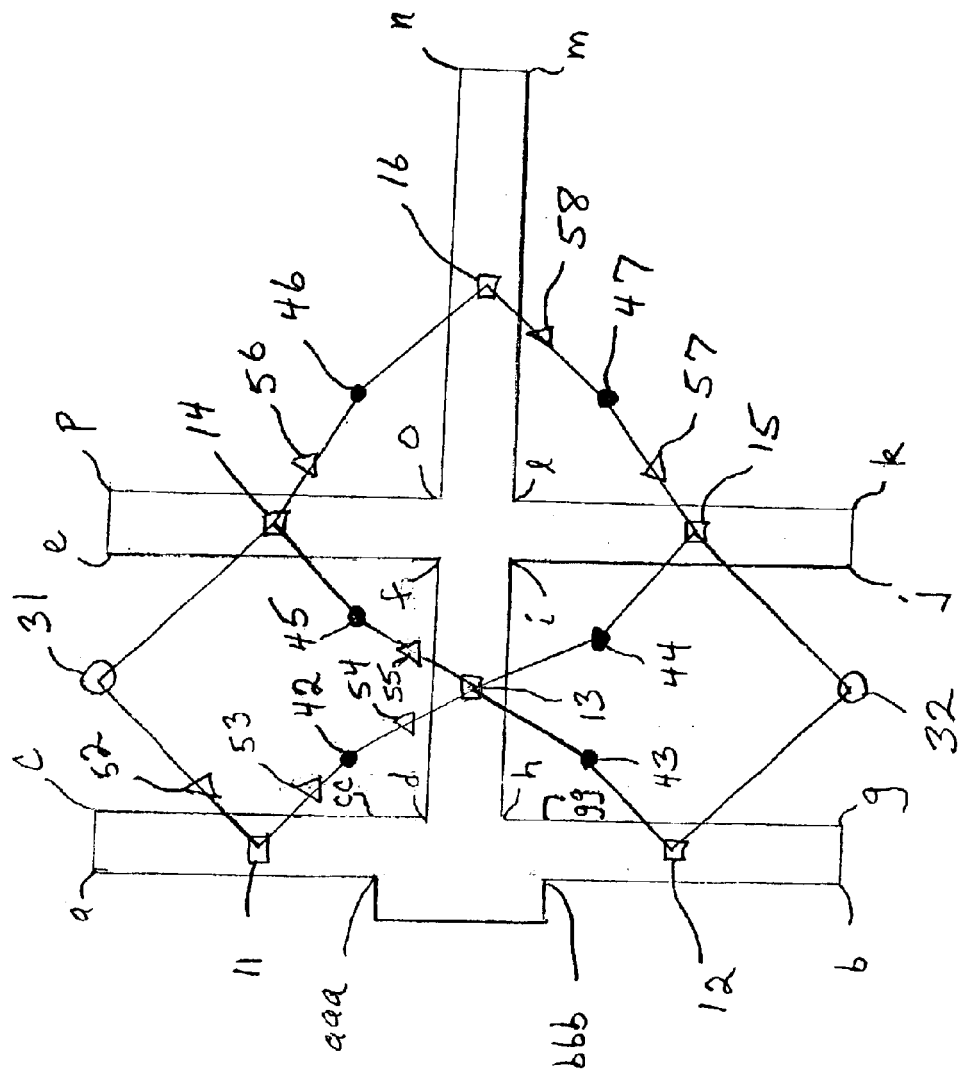
FIGS. 8B–8E illustrates examples of the design layout of FIG. 8A, modified to resolve layout violations.
Figure 8C:
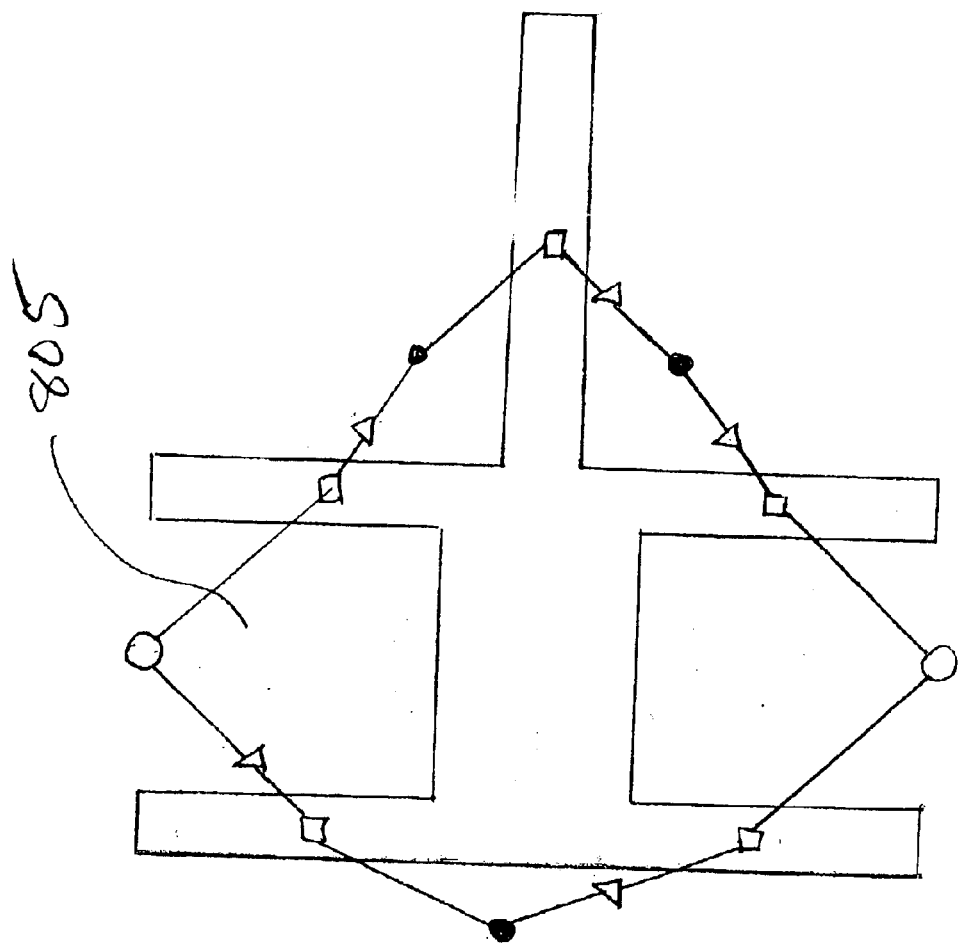
Figure 8D:
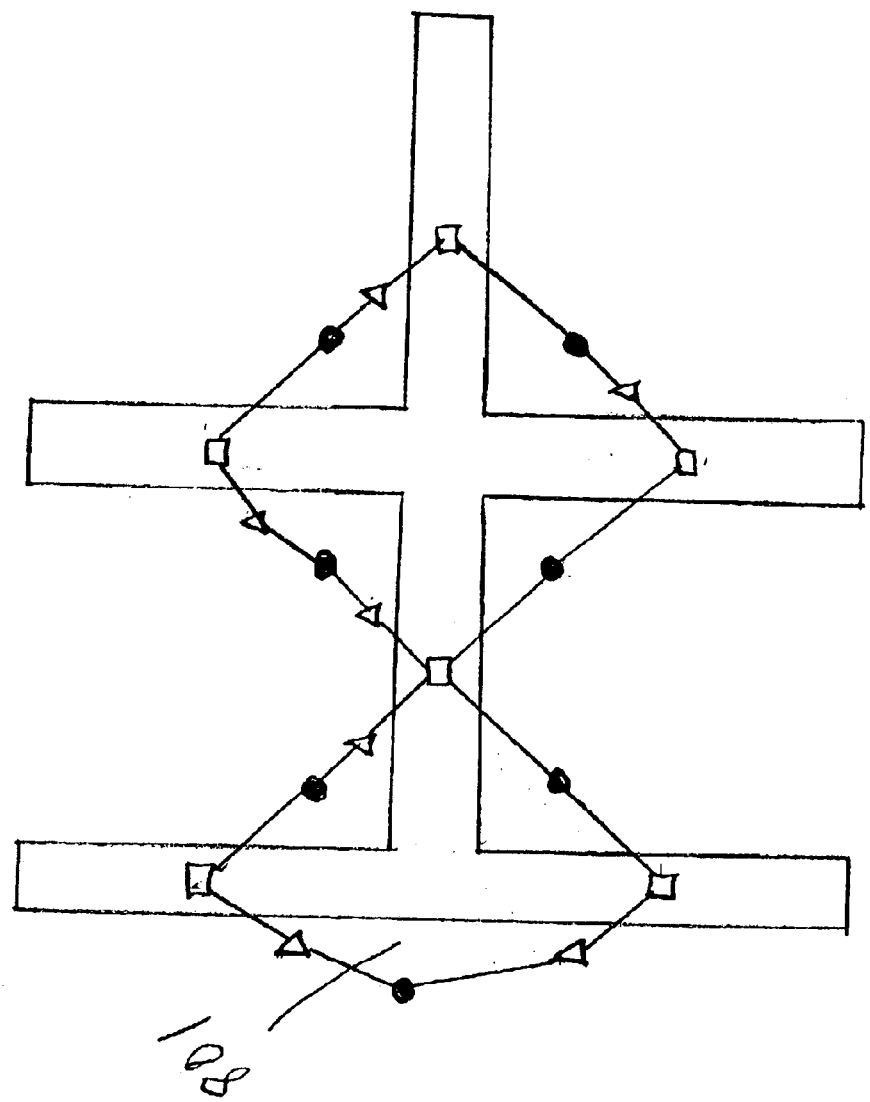
Figure 8E:
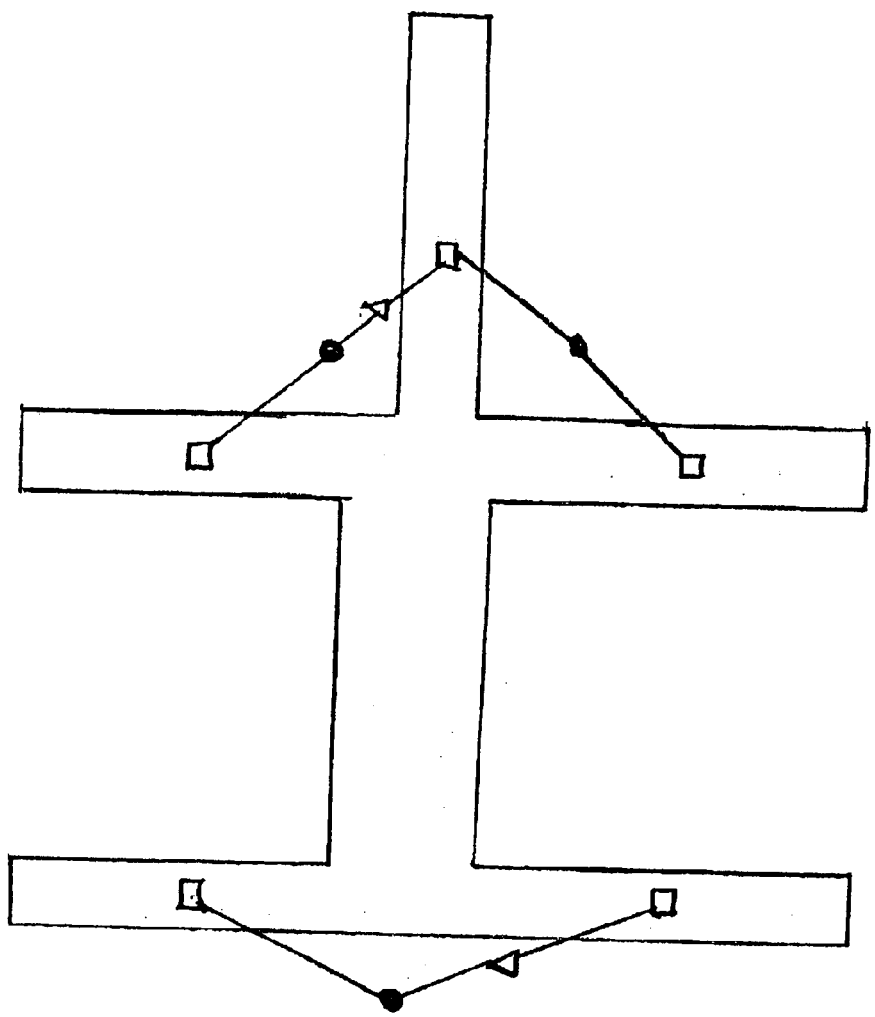

The effect of using cost analysis in conjunction with pattern analysis of a phase interlock graph in accordance with the present invention, is illustrated with reference to the example illustrated in FIG. 8A. The conflict face 801 indicates a T-junction conflict because it has three feature graph nodes, where two of the feature nodes have the same orientation different from the orientation of the third feature node, and only hard connection nodes are present. Here, a low cost solution is illustrated in FIG. 8B, where the T-junction has been widened along the edge segment aaa-bbb, which effectively breaks the hard connection between phase representor segments a-aaa and b-bbb, and resolves the conflict. This is a lower cost solution as compared to the alternative solution illustrated by reference to FIGS. 8C to 8E. In FIG. 8C, if the critical feature associated with feature node 13 is widened, this effectively removes feature node 13 and resolved the T-junction conflict of face 801. However, the resulting face 805 still contains an odd number of nodes including more than 3 feature nodes and more than one orientation. Thus, conflict face pattern 805 now indicates a bad critical segment. Further analysis on the graph needs to be done to resolve this remaining conflict. One possible solution is to remove a soft connection node in order to break the cycle, for example, by forcing the vertical critical segments to be spaced further apart. Since this solution entails more modification to the interlock graph and to the layout, the previously discussed solution of FIG. 8B is preferable.

Figure 3:
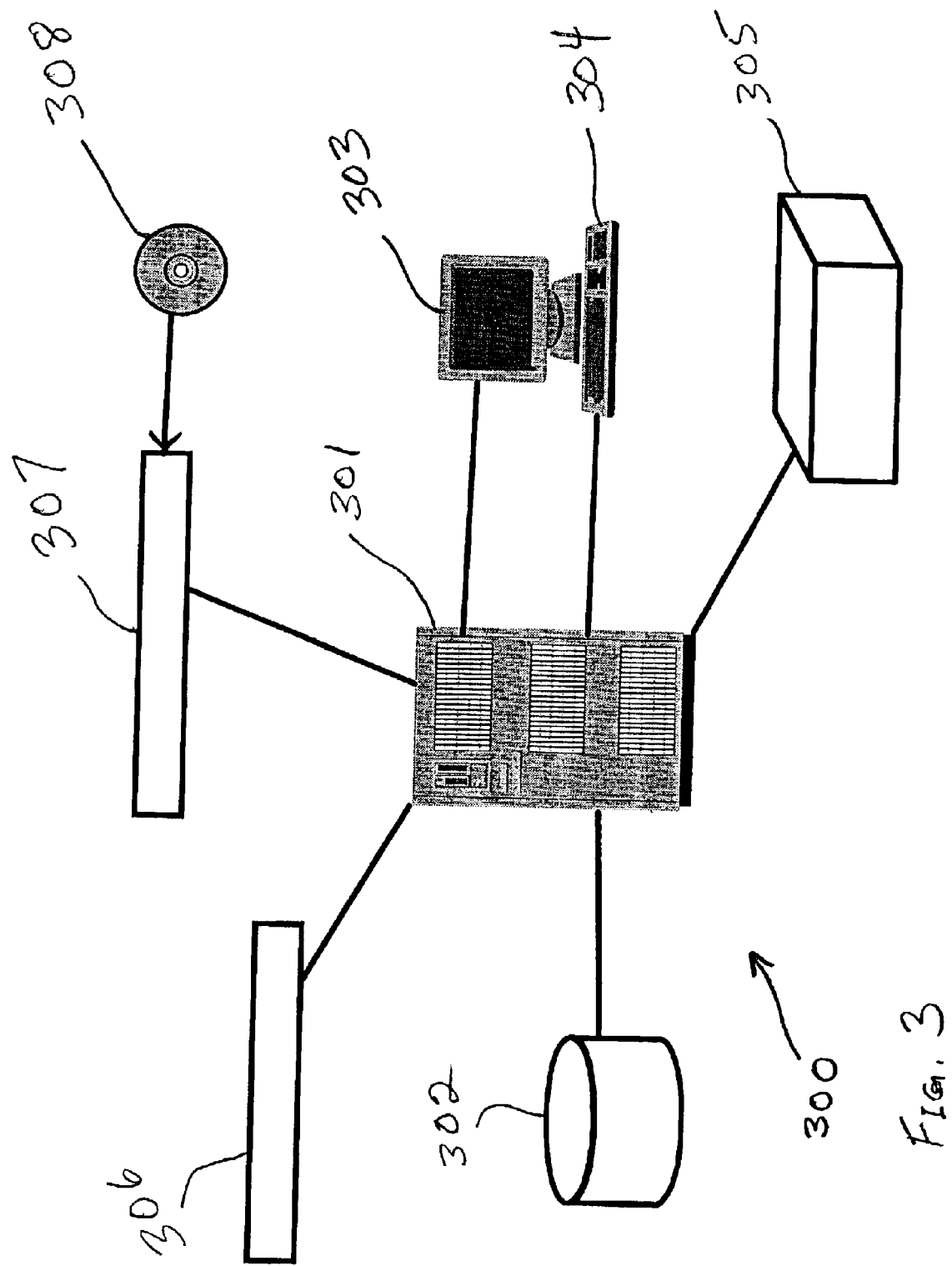
FIG. 3 illustrates a data processing system adapted for performing the method of the present invention.

FIG. 10 illustrates an embodiment of a process flow in accordance with the present invention which can be implemented with a computer-aided design system 300, such as illustrated in FIG. 3. FIG. 3 illustrates an example of a data processing or computer system 300 that is adapted for performing the method of the present invention. The system 300 includes a central processor 301 connected to a number of input-output and storage devices, including, but not limited to, a data storage device 302, a display device 303, a data entry device 304 such as a keyboard or mouse, an hardcopy output device 305 such as a printer or plotter, an input-output device 306, 307 which may be capable of transferring information to or from (i.e. reading from and/or writing to) a storage media 308 such as a compact disk or a magnetic disk or tape, which may contain information including data and/or instructions. The instructions and data for performing the method may be stored within the system 300, for example, in the data storage device 302 and then performed by the central processor 301 in a manner well known to those skilled in the art.

Figure 11:
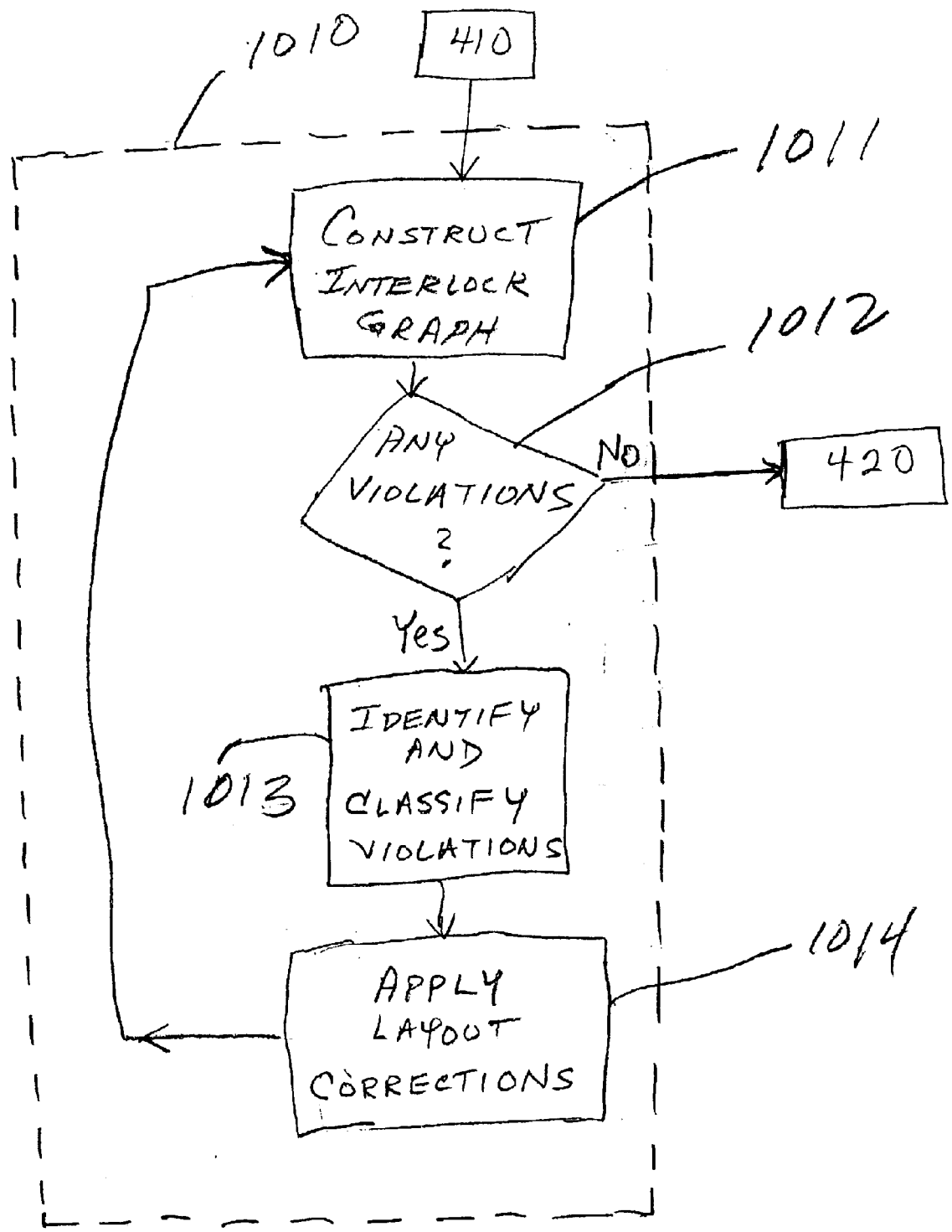

Computer readable instructions for performing the method of the present invention may be provided on a medium 308 as a program product. FIG. 10 illustrates a flow chart of a program product 308 implementing the method in accordance with the present invention. A circuit layout is provided (Block 401). The critical feature elements are identified (Block 410). Then (Block 1011 of FIG. 11) a planar interlock graph is constructed that includes nodes characterizing the key relationship between the critical feature elements and the desired RET lithographic layout features. The RET features could be phase shapes for altPSM mask designs, SRAF features, or other resolution enhancement features. The interlock graph is examined for patterns (e.g. faces) that indicate design violations, such as phase conflicts (Block 1012). Any violations are identified and classified (Block 1013). This is preferably performed by the central processor 301, but alternatively or in addition, could be displayed graphically on a display device 303, such as a monitor or other graphical display device, to allow a designer or engineer to identify and enter a command into the computer via an input device to select one or more corrective conflict resolution solutions. Corrections appropriate for that class of violations are applied to that portion of the layout by generating appropriate design constraints and rules, including manufacturability and cost estimates of layout modification (Block 1014), and applying those constraints during the legalization step 430 (FIG. 10). The interlock graph is updated again until the layout is conflict-free. A set of one or more conflict-free layouts may be generated, which can then be legalized in step 430 in accordance with the generated conflict resolution constraints and a cost analysis applied to select an optimal layout by methods known in the art (for example, see Heng et al., "Optimized Phase Shift Design Migration," U.S. Pat. No. 6,083,275).

It will be appreciated by those skilled in the art that the method and application to various layouts in accordance with the present invention is not limited to the embodiments discussed above. Accordingly, the invention is intended to encompass all such alternatives, modifications and variations which fall within the scope and spirit of the invention and the following claims.

We claim:

1. A method for designing an alternating phase shift mask (altPSM), the method comprising:

providing an initial feature layout of design elements to be printed, wherein said initial feature layout does not include phase shift shapes;

providing a layout rules set for designing a conflict-free altPSM layout;

identifying critical elements of said design elements, wherein each of said critical elements has a critical dimension;

assigning a feature node corresponding to each of said critical elements;

assigning phase shape representors disposed on opposing sides of each of said critical dimensions;

assigning a connection node between interacting adjacent phase representors which interact in accordance with an adjacency rules set;

constructing a planar interlock graph comprising said feature nodes, said connection nodes and connection paths between said feature nodes and said connection nodes;

analyzing said interlock graph to identify a violation, if any, of said layout rules set;

if a violation of said layout rules set exists, generating at least one layout constraint to correct said violation and form a violation-free feature layout; and assigning phase shift shapes corresponding to said phase representors in said violation-free feature layout in accordance with said layout rules set and with said at least one layout constraint to form a conflict-free altPSM layout.

2. The method of claim 1 further comprising assigning an auxiliary node located on each connection path on one side of each said feature node and between each said feature node and each connection on said one side of each said feature node.

3. The method of claim 1 further comprising providing a node pattern associated with a violation type, and wherein said analyzing further comprises identifying said node pattern within said interlock graph.

4. The method of claim 3 wherein said violation type is selected from the group consisting of a T-junction conflict, an odd-even run, a line-end conflict and a bad critical segment.

5. The method of claim 1 wherein said at least one layout constraint comprises one of a hierarchical set of solutions.

6. The method of claim 5 wherein said hierarchical set of solutions are prioritized in accordance with a cost analysis.

7. The method of claim 1 further comprising forming a plurality of conflict-free altPSM layouts.

8. A computer program product comprising:

computer readable instructions for causing a data processing system to perform method steps for designing an alternating phase shift mask (altPSM), said method steps comprising:

storing an initial feature layout of design elements to be printed, wherein said initial feature layout does not include phase shift shapes;

storing a layout rules set for designing a conflict-free altPSM layout;

identifying critical elements of said design elements, wherein each of said critical elements has a critical dimension;

assigning a feature node corresponding to each of said critical elements;

assigning phase shape representors disposed on opposing sides of each of said critical dimensions;

assigning a connection node between interacting adjacent phase representors which interact in accordance with an adjacency rules set;

constructing a planar interlock graph comprising said feature nodes, said connection nodes and connection paths between said feature nodes and said connection nodes;

analyzing said interlock graph to identify a violation, if any, of said layout rules set;

if a violation of said layout rules set exists, generating at least one layout constraint to correct said violation and form a violation-free feature layout; and assigning phase shift shapes corresponding to said phase representors in said violation-free feature layout in accordance with said layout rules set and with said at least one layout constraint to form a conflict-free altPSM layout.

9. The computer program product of claim 8 wherein said method steps further comprise assigning an auxiliary node located on each connection path on one side of each said feature node and between each said feature node and each connection on said one side of each said feature node.

10. The computer program product of claim 8 wherein said method steps further comprise storing a node pattern associated with a violation type, and wherein said analyzing further comprises identifying said node pattern within said interlock graph.

11. The computer program product of claim 10 wherein said violation type is selected from the group consisting of a T-junction conflict, an odd-even run, a line-end conflict and a bad critical segment.

12. The computer program product of claim 8 wherein said at least one layout constraint comprises one of a hierarchical set of solutions.

13. The computer program product of claim 12 wherein said hierarchical set of solutions are prioritized in accordance with a cost analysis.

14. The computer program product of claim 8 wherein said method steps further comprise forming a plurality of conflict-free altPSM layouts.

15. A data processing system for designing a lithographic mask containing resolution enhancement technique (RET) features, the system comprising:
- a computer system having data and instructions stored therein, said data comprising:
- an initial feature layout including critical elements having a critical dimension for which associated RET features are to be defined; and
- representor placeholders for each RET feature potentially associated with each of said critical dimensions, said instructions comprising:
- identifying critical elements of said design elements, wherein each of said critical elements has a critical dimension;
- assigning a feature node corresponding to each of said critical elements;
- assigning phase shape representors disposed on opposing sides of each of said critical dimensions;
- assigning a connection node between interacting adjacent phase representors which interact in accordance with an adjacency rules set;
- constructing a planar interlock graph comprising said feature nodes, said connection nodes and connection paths between said feature nodes and said connection nodes; and
- analyzing said interlock graph to identify a violation, if any, of said layout rules set.

16. The data processing system of claim 15, wherein said instructions further comprise:
- if a violation of said layout rules set exists, generating at least one layout constraint to correct said violation and form a violation-free feature layout; and
- assigning phase shift shapes corresponding to said phase representors in said violation-free feature layout in accordance with said layout rules set and with said at least one layout constraint to form a conflict-free altPSM layout.

17. The data processing system of claim 15, further comprising a graphical display device connected to said computer system, and wherein said instructions further comprise:
- after said step of analyzing said interlock graph for violations, if a violation of said layout rules set exists, identifying a portion of said interlock graph where said violation exists; and
- displaying said portion of said interlock graph on said graphical display device.

18. The data processing system of claim 17 further comprising an input device connected to said computer system, wherein said instructions further comprise, after said displaying:
- accepting a command from said input device;
- generating at least one layout constraint to correct said violation and form a violation-free feature layout in accordance with said command; and
- assigning phase shift shapes corresponding to said phase representors in said violation-free feature layout in accordance with said layout rules set and with said at least one layout constraint to form a conflict-free altPSM layout.

* * * * *